United States Patent
Kulkarni et al.

(10) Patent No.: US 10,630,314 B1
(45) Date of Patent: Apr. 21, 2020

(54) METHOD AND SYSTEM FOR ASYNCHRONOUS SERIALIZATION OF MULTIPLE SERIAL COMMUNICATION SIGNALS

(71) Applicant: NXP B.V., Eindhoven (NL)

(72) Inventors: Abhijeet Chandrakant Kulkarni, Chandler, AZ (US); Siamak Delshadpour, Phoenix, AZ (US); Krishnan Tiruchi Natarajan, Cupertino, CA (US); Steven Daniel, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/444,198

(22) Filed: Jun. 18, 2019

(51) Int. Cl.
*H03M 9/00* (2006.01)

(52) U.S. Cl.
CPC ..................... *H03M 9/00* (2013.01)

(58) Field of Classification Search
CPC ..................................................... H03M 9/00
See application file for complete search history.

(56) References Cited

U.S. PATENT DOCUMENTS

| | | | | |
|---|---|---|---|---|
| 4,310,922 A | * | 1/1982 | Lichtenberger | H04J 3/16 370/306 |
| 4,701,912 A | * | 10/1987 | Bueno | H03M 5/14 370/474 |
| 6,064,697 A | * | 5/2000 | Yoshikawa | H03M 5/145 375/242 |
| 6,606,360 B1 | * | 8/2003 | Dunning | H04L 7/0338 375/354 |
| 8,405,426 B2 | | 3/2013 | Lee et al. | |

OTHER PUBLICATIONS

Rovere, Giovanni et al. "Design of a QDI Asynchronous AER Serializer/Desearializer Link in 180nm for Event-Based Sensors for Robotic Applications"; IEEE Symposium on Circuits and Systems (ISCAS) 4 page (May 2015).

* cited by examiner

*Primary Examiner* — Howard Williams

(57) ABSTRACT

Embodiments of a method and a device are disclosed. In an embodiment, an electronic device includes a plurality of input ports configured to receive at least two serial communication signals, an encoder circuit configured to encode the at least two serial communication signals based on signal edges of the at least two serial communication signals to generate an encoded serial communication signal, the encoded serial communication signal enabling reconstruction of the at least two serial communication signals independent of a clock signal, and a transmitter configured to transmit the encoded serial communication signal.

20 Claims, 16 Drawing Sheets

300

| | OCCURRENCE | SIGNAL 1 EDGE | SIGNAL 2 EDGE | SIGNAL 3 EDGE | CODE |
|---|---|---|---|---|---|
| FIRST SET OF SIGNAL EDGES | HIGH | – | YES | – | 1000 |
| SECOND SET OF SIGNAL EDGES | LOW | – | YES | YES | 1011 |
| THIRD SET OF SIGNAL EDGES | LOW | – | – | YES | 1100 |
| FOURTH SET OF SIGNAL EDGES | HIGH | YES | YES | – | 1001 |
| FIFTH SET OF SIGNAL EDGES | HIGH | YES | – | – | 1010 |
| | DEFER SIGNAL 1 | YES | YES | YES | – |
| | DEFER SIGNAL 1 | YES | – | YES | – |

| OCCURRENCE | SIGNAL 1 EDGE | SIGNAL 2 EDGE | SIGNAL 3 EDGE | CODE |
| --- | --- | --- | --- | --- |
| HIGH | - | YES | - | 1000 |
| LOW | - | YES | YES | 1011 |
| LOW | - | - | YES | 1100 |
| HIGH | YES | YES | - | 1001 |
| HIGH | YES | - | - | 1010 |
| DEFER SIGNAL 1 | YES | YES | YES | - |
| DEFER SIGNAL 1 | YES | - | YES | - |

{ FIRST SET OF SIGNAL EDGES, SECOND SET OF SIGNAL EDGES, THIRD SET OF SIGNAL EDGES, FOURTH SET OF SIGNAL EDGES, FIFTH SET OF SIGNAL EDGES }

METHOD AND SYSTEM FOR ASYNCHRONOUS SERIALIZATION OF MULTIPLE SERIAL COMMUNICATION SIGNALS

BACKGROUND

A host device and a client device may be configured to communicate signals over a single communication line (also referred to as a power bus or power line) to simplify the wiring between the host device and the client device. For example, the host device and the client device may implement a Universal Serial Bus (USB) serial communication protocol or an embedded USB (eUSB) serial communication protocol for transferring different types of data. However, the host device and the client device may need to process (e.g., serialize) the signals of some serial communication protocols (e.g., the eDN and eDP signals of the eUSB serial communication protocol) to enable transmissions over the single communication line. Such processing of the signals for transmission over the single communication line may not meet the requirements (e.g., jitter requirements) of some serial communication protocols and, therefore, the host device and client device may not be able to transfer data over the single communication line in some scenarios.

SUMMARY

Embodiments of a method and a device are disclosed. In an embodiment, an electronic device includes a plurality of input ports configured to receive at least two serial communication signals, an encoder circuit configured to encode the at least two serial communication signals based on signal edges of the at least two serial communication signals to generate an encoded serial communication signal, the encoded serial communication signal enabling reconstruction of the at least two serial communication signals independent of a clock signal, and a transmitter configured to transmit the encoded serial communication signal.

In an embodiment, the encoder circuit includes a signal edge detector circuit configured to detect a set of the signal edges of the at least two serial communication signals for a time period, and a modulator circuit configured to obtain a predetermined code that corresponds to the detected set of signal edges. The encoded serial communication signal includes the predetermined code, and the predetermined code enables the reconstruction of the at least two serial communication signals for the time period.

In an embodiment, the encoder circuit includes a signal edge detector circuit configured to detect a set of the signal edges of the at least two serial communication signals for each of a plurality of time periods, and a modulator circuit configured to obtain predetermined codes that correspond to the detected set of signal edges in each of the plurality of time periods. The encoded serial communication signal includes the predetermined codes, and the predetermined codes enable the reconstruction of the at least two serial communication signals for the plurality of time periods.

In an embodiment, each of the predetermined codes includes a combination of bit values, and the encoded serial communication signal is transmitted via a single wire as a plurality of pulses that indicate the combination of bit values.

In an embodiment, the at least two serial communication signals are associated with two or more different serial communication protocols.

In an embodiment, the electronic device further includes a receiver configured to receive a second encoded serial communication signal, the second encoded serial communication signal enabling reconstruction of the at least two serial communication signals, a decoder circuit configured to decode the second encoded serial communication signal independent of the clock signal to obtain one or more sets of the signal edges of the at least two serial communication signals, and a signal edge generator circuit configured to reconstruct the at least two serial communication signals based on the obtained one or more sets of signal edges.

In an embodiment, the decoder circuit includes a demodulator circuit configured to obtain a code from the second encoded serial communication signal, and a comparing circuit configured to match the code to a corresponding set of signal edges of the at least two serial communication signals.

Another embodiment of the electronic device is disclosed. The electronic device includes a receiver configured to receive an encoded serial communication signal, the encoded serial communication signal enabling reconstruction of at least two serial communication signals: a decoder circuit configured to decode the encoded serial communication signal independent of a clock signal to obtain one or more sets of signal edges of the at least two serial communication signals, and a signal edge generator circuit configured to reconstruct the at least two serial communication signals based on the obtained one or more sets of signal edges.

In an embodiment, the decoder circuit includes a demodulator circuit configured to obtain a code from the encoded serial communication signal, and a comparing circuit configured to match the code to a corresponding set of signal edges of the at least two serial communication signals.

In an embodiment, the decoder circuit includes a demodulator circuit configured to obtain a plurality of codes from the encoded serial communication signal, the plurality of codes enabling the reconstruction of the at least two serial communication signals for a plurality of time periods, and a comparing circuit configured to match each of the plurality of codes to a corresponding set of signal edges of the at least two serial communication signals. The signal edge generator circuit is further configured to reconstruct the at least two serial communication signals for each of the plurality of time periods.

In an embodiment, each of the plurality of codes includes a combination of bit values, and the encoded serial communication signal is received via a single wire as a plurality of pulses that indicate the combination of bit values.

In an embodiment, the at least two serial communication signals are associated with two or more different serial communication protocols.

In an embodiment, the electronic device further includes a plurality of input ports configured to receive the at least two serial communication signals, an encoder circuit configured to encode the at least two serial communication signals based on signal edges of the at least two serial communication signals to generate a second encoded serial communication signal, the second encoded serial communication signal enabling reconstruction of the at least two serial communication signals independent of a clock signal, and a transmitter configured to transmit the second encoded serial communication signal.

In an embodiment the encoder circuit includes a signal edge detector circuit configured to detect a set of the signal edges of the at least two serial communication signals for a time period, and a modulator circuit configured to obtain a predetermined code that corresponds to the detected set of signal edges. The second encoded serial communication signal includes the predetermined code, and the predetermined code enables the reconstruction of the at least two serial communication signals for the time period.

In an embodiment, a method for an electronic device is disclosed. The method involves receiving at least two serial communication signals, encoding the at least two serial communication signals based on signal edges of the at least two serial communication signals to generate an encoded serial communication signal, the encoded serial communication signal enabling reconstruction of the at least two serial communication signals independent of a clock signal, and transmitting the encoded serial communication signal.

In an embodiment, the encoding includes detecting a set of the signal edges of the at least two serial communication signals for a time period, and obtaining a predetermined code that corresponds to the detected set of signal edges. The encoded serial communication signal includes the predetermined code, and the predetermined code enables the reconstruction of the at least two serial communication signals for the time period.

In an embodiment, the encoding includes detecting a set of the signal edges of the at least two serial communication signals for each of a plurality of time periods, and obtaining predetermined codes that correspond to the detected set of signal edges in each of the plurality of time periods. The encoded serial communication signal includes the predetermined codes, and the predetermined codes enable the reconstruction of the at least two serial communication signals for the plurality of time periods.

In an embodiment, each of the predetermined codes includes a combination of bit values, and the encoded serial communication signal is transmitted via a single wire as a plurality of pulses that indicate the combination of bit values.

In an embodiment, the at least two serial communication signals are associated with two or more different serial communication protocols.

In an embodiment, the method further involves receiving a second encoded serial communication signal, wherein the second encoded serial communication signal enables reconstruction of the at least two serial communication signals, decoding the second encoded serial communication signal independent of the clock signal to determine one or more sets of the signal edges of the at least two serial communication signals, and reconstructing the at least two serial communication signals based on the determined one or more sets of signal edges.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 3 depicts an example truth table including five sets of signal edges that a device may be configured to detect and corresponding codes in accordance with various embodiments of the disclosure.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
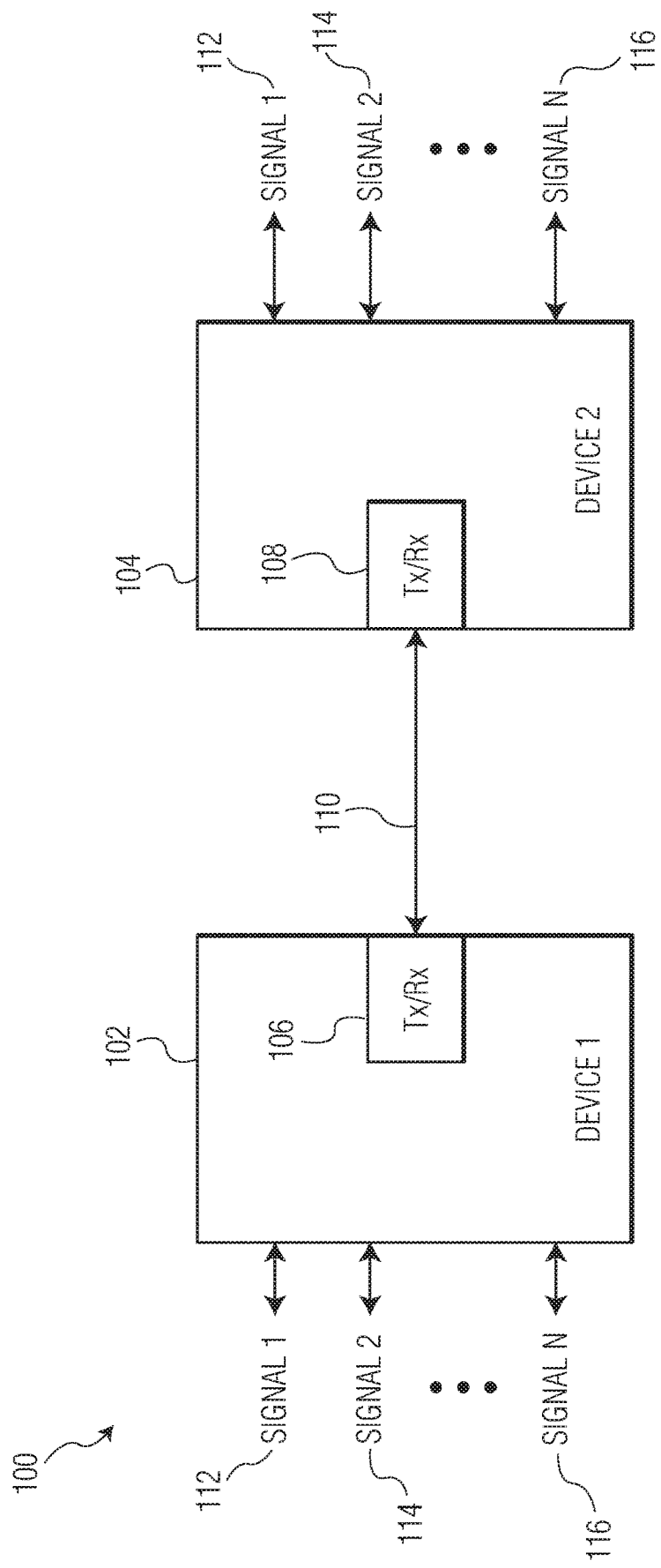
FIG. 1 depicts a system that includes two devices in communication with one another in accordance with various embodiments of the disclosure.

FIG. 1 depicts a system 100 that includes two devices, device 1 102 and device 2 104, in communication with one another in accordance with various embodiments of the disclosure. In an embodiment, the device 1 102 and device 2 104 may each be an electronic device, such as a System-on-Chip (SoC), a microcontroller, a processing circuit, an integrated circuit, or other suitable type of electronic device. In the embodiments described herein, device 1 102 may be a host device and device 2 104 may be a client device. In other embodiments, device 2 104 may be a host device and device 1 102 may be a client device. Device 1 102 may communicate with device 2 104 by implementing a transceiver (Tx/Rx) 106 to transmit and/or receive communication signals (e.g., serial communication signals) over the communication medium 110. Device 2 104 may communicate with device 1 102 by implementing a transceiver (Tx/Rx) 108 to transmit and/or receive communication signals (e.g., serial communication signals) over the communication medium 110. In an embodiment, the communication medium 110 may be a single wire, a single line, a trace on a printed circuit board, or other suitable type of communication medium. In an embodiment, the communication medium 110 may serve as a One Wire Interface (OWI).

As shown in FIG. 1, device 1 102 may receive a number of serial communication signals, such as signal 1 112, signal 2 114, and signal N 116. In one example scenario, signal 1 112 may be a single-ended signal for serial data communication, such as a Universal Asynchronous Receiver/Transmitter (UART) signal, an Inter-Integrated Circuit (I²C) signal, a Joint Test Action Group (JTAG) signal, or other suitable type of single-ended signal. In this example scenario, signal 2 114 may be a first signal of a differential signaling pair (e.g., the D– or eDN signal of a universal serial bus (USB) data signal) and signal N 116 may be a second signal of the differential signaling pair (e.g., the D+ or eDP signal of a USB data signal). In one embodiment, signal 2 114 and signal N 116 may have priority for encoding and transmission purposes, whereas encoding and transmission of signal 1 112 may be deferred. In one embodiment, if no signal edges are expected in signal 2 114 and signal N 116, the device 1 102 may transmit an encoded serial communication signal carrying the data in signal 1 112 at set time intervals.

As described in detail herein, the device 1 102 may asynchronously (e.g., without using a clock signal) serialize an N number of signals (e.g., the signal 1 112, signal 2 114, and signal N 116) to generate an encoded serial communication signal (also referred to as a combined serial communication signal or an encoded signal). The device 1 102 may transmit the encoded serial communication signal to the device 2 104 over the communication medium 110. In one embodiment, one device (e.g., device 1 102 or device 2 104) may transmit an encoded serial communication signal over the communication medium 110 at a given time.

The device 2 104 may receive the encoded serial communication signal and may decode the encoded serial communication signal to reconstruct the N number of signals (e.g., the signal 1 112, signal 2 114, and signal N 116). Since the techniques disclosed herein for serializing and deserializing an N number of signals involve the use of signal edges to generate the required timing and/or time frames, the N number of signals may be serialized/deserialized independent of a clock signal. It should be understood that the device 2 104 may also implement the techniques disclosed herein to serialize the N signals (e.g., the signal 1 112, signal 2 114, and signal N 116) and transmit an encoded serial communication signal to the device 1 102, which the device 1 102 may use to reconstruct the N number of signals.

Figure 2:
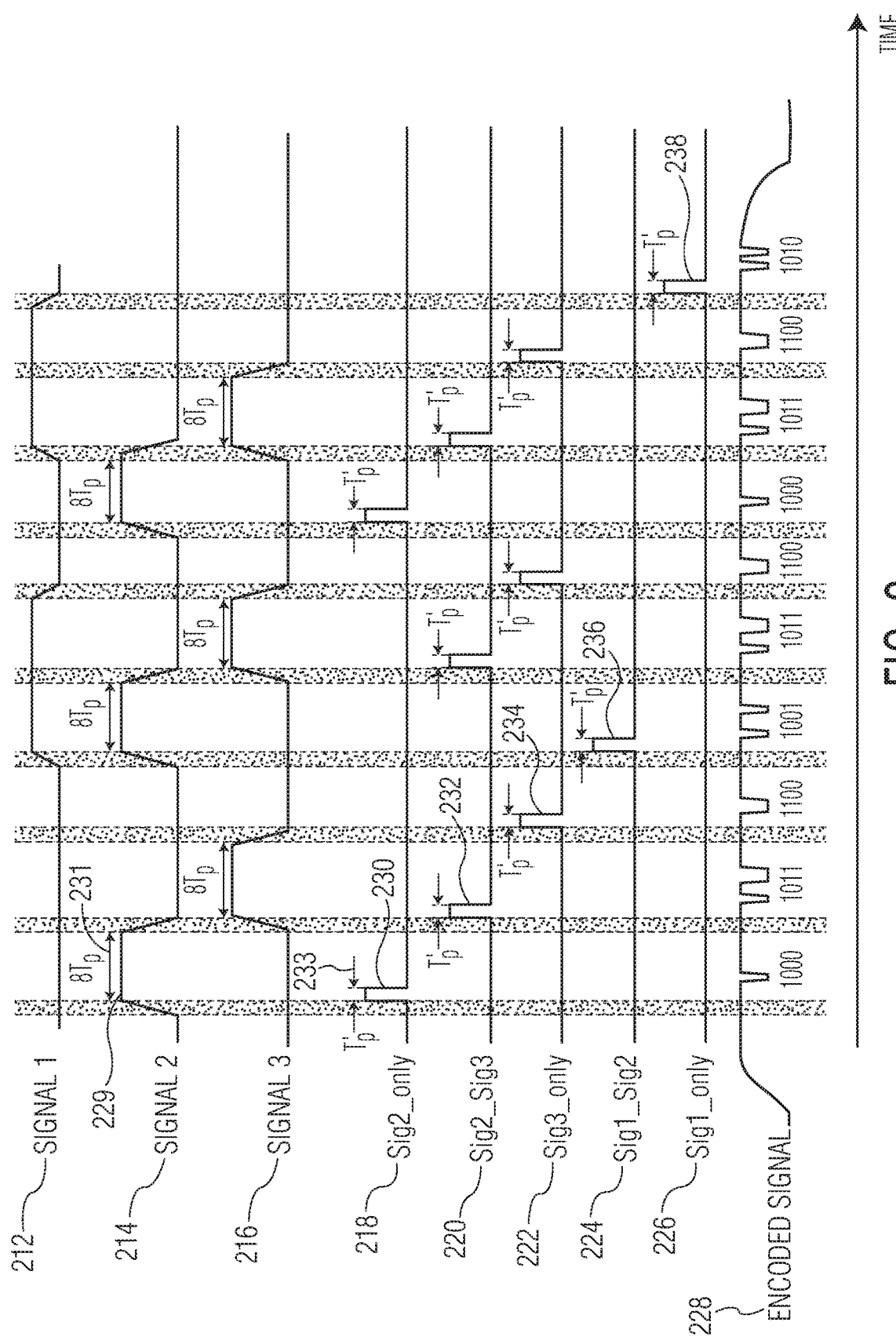
FIG. 2 depicts a signal diagram showing the serialization of three exemplary serial communication signals in accordance with various embodiments of the disclosure.

FIG. 2 depicts a signal diagram showing the serialization of three exemplary serial communication signals (e.g., signal 1 212, signal 2 214, and signal 3 216) in accordance with various embodiments of the disclosure. It should be understood that the signal diagram of FIG. 2 represents one example implementation and that the techniques described herein may be used to serialize a different number of serial communication signals than the three serial communication signals shown in FIG. 2. Therefore, in one embodiment, the techniques described herein may be used to serialize at least two serial communication signals.

In FIG. 2, signal 1 212, signal 2 214, and signal 3 216 may respectively correspond to signal 1 112, signal 2 114, and signal N 116 previously described with reference to FIG. 1. In an embodiment, with reference to FIG. 2, the device 1 102 may receive the signal 1 212, signal 2 214, and signal 3 216 and may encode these serial communication signals based on their signal edges to generate an encoded serial communication signal 228.

The device 1 102 may detect a set of signal edges of the signal 1 212, signal 2 214, and signal 3 216 during a time period (also herein referred to as a time window). In one embodiment, the time period may be approximately equal to a pulse duration in the signal 1 212, signal 2 214, or signal 3 216. For example, the time period may be approximately equal to the pulse duration 231 of the pulse 229 in signal 2 214. As shown in FIG. 2, the pulse duration 231 may be expressed in terms of a pulse duration value $T_p$. In one example, the pulse duration 231 in FIG. 2 may be defined as $8T_p$, and the pulse duration value $T_p$ may be approximately 10 nanoseconds (ns). Therefore, in this example, the pulse duration 231 may be 80 ns.

The detected set of signal edges for the time period may be one of a predetermined number of sets of signal edges. In FIG. 2, for example, there may be five possible sets of signal edges that the device 1 102 is configured to detect, such as a first set that includes only a signal edge of signal 2 214, a second set that includes a signal edge of signal 2 214 and a signal edge of signal 3 216, a third set that includes only a signal edge of signal 3 216, a fourth set that includes only a signal edge of signal 1 212 and a signal edge of signal 2 214, and a fifth set that includes only a signal edge of signal 1 212. The five sets of signal edges that the device 1 102 may be configured to detect are shown in the truth table 300 of FIG. 3.

In one embodiment, and as shown in FIG. 2, the device 1 102 may generate a pulse in an edge detection signal when one of the sets of signal edges is detected. For example, the device 1 102 may generate a pulse 230 in the edge detection signal Sig2_only 218 when only a signal edge of signal 2 214 is detected. The device 1 102 may generate a pulse 232 in the edge detection signal Sig2_Sig3 220 when a signal edge of signal 2 214 and a signal edge of signal 3 216 are detected. The device 1 102 may generate a pulse 234 in the edge detection signal Sig3_only 222 when only a signal edge of signal 3 216 is detected. The device 1 102 may generate a pulse 236 in the edge detection signal Sig1_Sig2 224 when a signal edge of signal 1 212 and a signal edge of signal 2 214 are detected. The device 1 102 may generate a pulse 238 in the edge detection signal Sig1_only 226 when only a signal edge of signal 1 212 is detected.

In one embodiment, a pulse in an edge detection signal may have a pulse duration $T_p'$ that is less than or equal to the previously described pulse duration value $T_p$ (e.g., $T_p' \leq T_p$). For example, if the pulse duration value $T_p$ is 10 ns, the pulse duration $T_p'$ of the pulse 230 (e.g., pulse duration 233) in the edge detection signal Sig2_only 218 may be less than or equal to 10 ns.

The device 1 102 may obtain a predetermined code for each detected set of signal edges of the signal 1 212, signal 2 214, and signal 3 216. In an embodiment, each predetermined code may be a unique combination of bits. For example, with reference to FIG. 2, the device 1 102 may obtain the code '1000' when only a signal edge of signal 2 214 is detected (e.g., in response to the pulse 230 in the edge detection signal Sig2_only 218). The device 1 102 may obtain the code '1011' when a signal edge of signal 2 214 and a signal edge of signal 3 216 are detected (e.g., in response to the pulse 232 in the edge detection signal Sig2_Sig3 220). The device 1 102 may obtain the code '1100' when only a signal edge of signal 3 216 is detected (e.g., in response to the pulse 234 in the edge detection signal Sig3_only 222). The device 1 102 may obtain the code '1001' when a signal edge of signal 1 212 and a signal edge of signal 2 214 are detected (e.g., in response to the pulse 236 in the edge detection signal Sig1_Sig2 224). The device 1 102 may obtain the code '1010' when only a signal edge of signal 1 212 is detected (e.g., in response to the pulse 238 in the edge detection signal Sig1_only 226).

The device 1 102 may include each of the obtained codes in an encoded serial communication signal and may transmit the encoded serial communication signal to the device 2 104 over the communication medium 110. In an embodiment, the encoded serial communication signal may be transmitted as a series of pulses that indicate the combination of bit values. In an embodiment, the series of pulses that indicate the combination of bit values may begin with a start marker-pulse (also referred to as a start marker bit) and may end with an end marker pulse (also referred to as an end marker bit). For example, as shown in FIG. 2, the device 1 102 may include the obtained codes (e.g., one or more of the example codes '1000', '1011', '1100', '1001', '1010') in the encoded serial communication signal 228 and may transmit the encoded serial communication signal 228 as a series of pulses that indicate the bit values of the codes to the device 2 104. As described in detail herein, the device 2 104 may receive and decode the encoded serial communication signal 228 to reconstruct signal 1 212, signal 2 214, and/or signal 3 216.

Figure 4A:
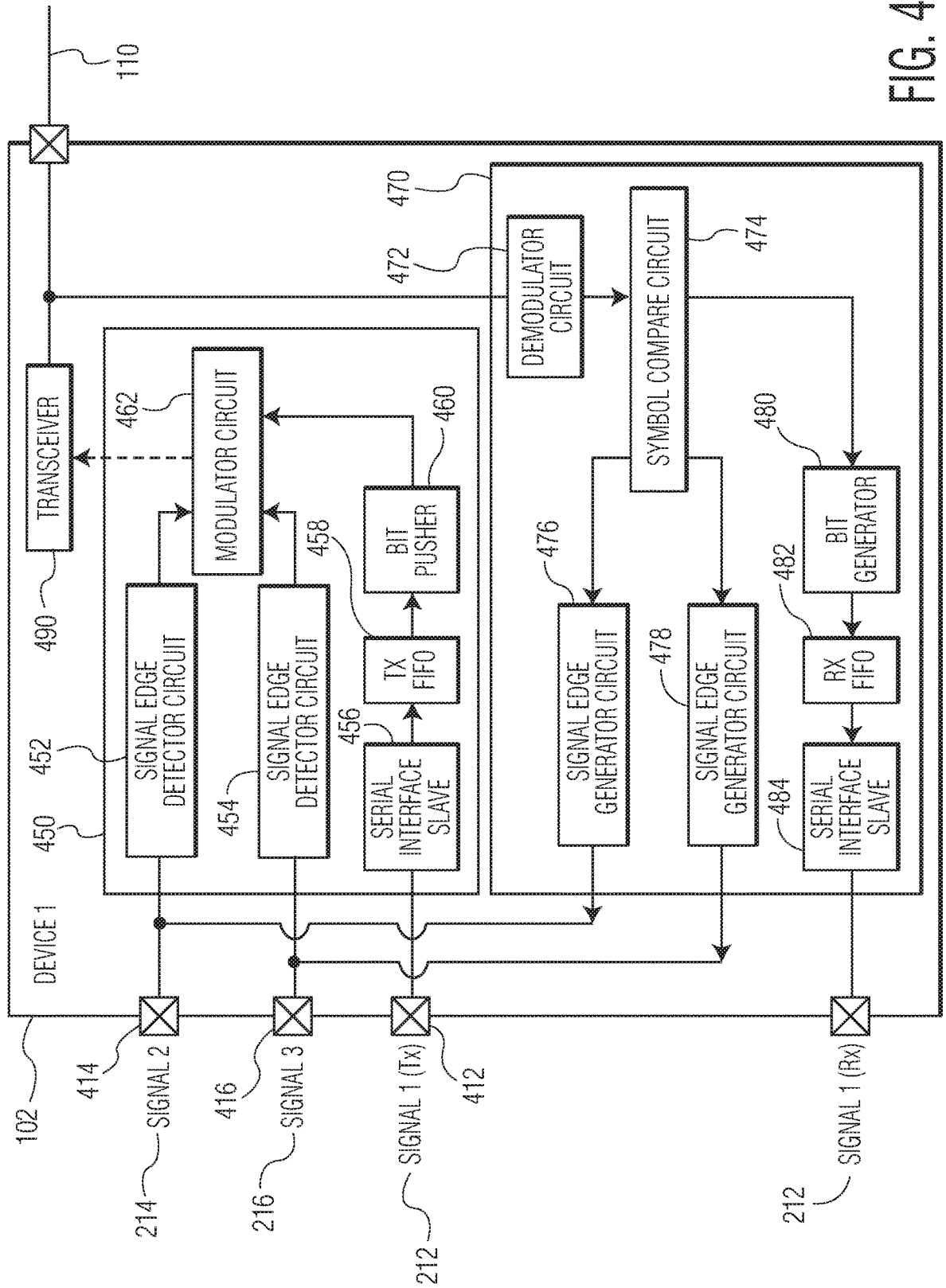
FIGS. 4A and 4B depict exemplary architectures of two devices in accordance with various embodiments of the disclosure.
Figure 4B:
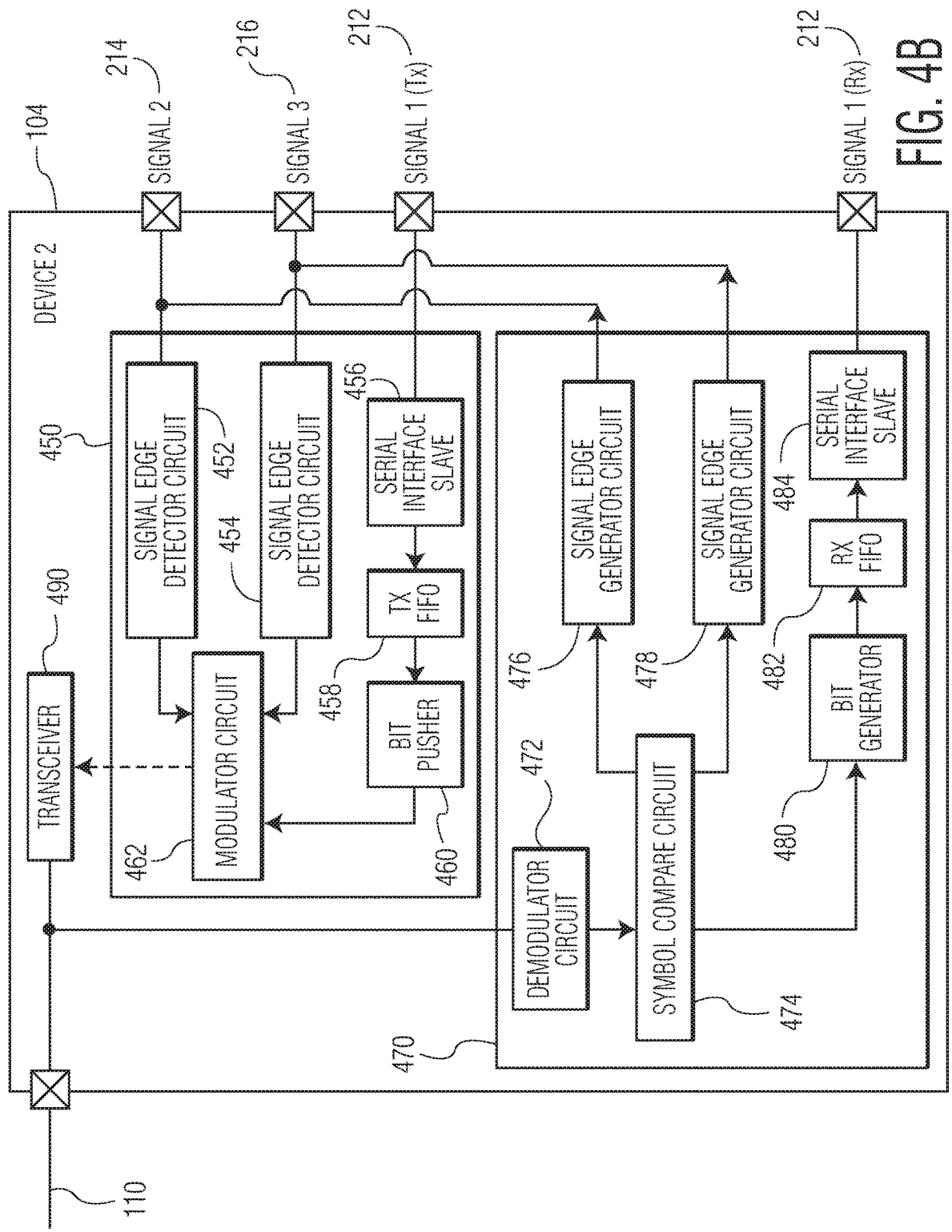

FIGS. 4A and 4B depict exemplary architectures of the device 1 102 and the device 2 104 in accordance with various embodiments of the disclosure. As shown in FIG. 4A, the device 1 102 may include an encoder circuit 450, a decoder circuit 470, and a transceiver (Tx/Rx) 490. The encoder circuit 450 may include signal edge detector circuits 452, 454 that are configured to detect the respective signal edges of signal 2 214 and signal 3 216 (e.g., signal 2 214 and signal 3 216 received at input ports 414, 416) and to indicate the detected signal edges to the modulator circuit 462. The encoder circuit 450 may further include a serial interface slave device 456, a first in, first out (FIFO) buffer 458, and a bit pusher 460. The serial interface slave device 456 may receive a serial data signal at input port 412. In one example, the serial interface slave device 456 may be a UART slave device. In an embodiment, the bit pusher 460 may be configured to obtain bits from the FIFO buffer 458 and to sequentially provide the obtained bits to the modulator circuit 462. In an embodiment, the signal edge detector circuit 452, signal edge detector circuit 454, serial interface slave device 456, FIFO buffer 458, and the bit pusher 460 may be collectively referred to as a signal edge detector circuit.

The modulator circuit 462 may detect a set of signal edges of the signal 1 212, signal 2 214, and the signal 3 216 based on the information received from the signal edge detector circuits 452, 454 and the bit pusher 460. The modulator circuit 462 may obtain a predetermined code for the detected set of signal edges of the signal 1 212, signal 2 214, and signal 3 216 and may generate an encoded serial communication signal (e.g., the encoded serial communication signal 228) and may provide the encoded serial communication signal to the transceiver 490. The transceiver 490 may transmit the encoded serial communication signal (e.g., to device 2 104 shown in FIG. 4B) over the communication medium 110. In an embodiment, the transceiver 490 may transmit the encoded serial communication signal as a series of pulses indicating one or more predetermined codes.

As further shown in FIG. 4A, the decoder circuit 470 may include a demodulator circuit 472, a symbol compare circuit 474 (also referred to as a comparing circuit), and signal edge generator circuits 476, 478 that are configured to generate the respective signal edges of signal 2 214 and signal 3 216. The decoder circuit 470 may further include a bit generator 480, a FIFO buffer 482, and a serial interface slave device 484. In one example, the serial interface slave device 484 may be a UART slave device. In an embodiment, the bit generator 480 may be configured to sequentially provide bits to the FIFO buffer 482. In an embodiment, the signal edge generator circuit 476, signal edge generator circuit 478, bit generator 480, FIFO buffer 482, and serial interface slave device 484 may be collectively referred to as a signal edge generator circuit.

In an embodiment, the device 1 102 may receive an encoded serial communication signal (e.g., the encoded serial communication signal 228) over the communication medium 110 and may provide the encoded serial communication signal to the demodulator circuit 472. The demodulator circuit 472 may obtain a predetermined code included in the encoded serial communication signal and may provide the predetermined code to the symbol compare circuit 474. The symbol compare circuit 474 may match the predetermined code to a corresponding set of signal edges of signal 1 212, signal 2 214, and/or signal 3 216. The symbol compare circuit 474 may indicate the presence of any signal edges to the signal edge generator circuits 476, 478 and the bit generator 480 based on the set of signal edges of signal 1 212, signal 2 214, and/or signal 3 216, which enables the decoder circuit to reconstruct the signal 1 212, signal 2 214, and signal 3 216.

As shown in FIG. 4B, the device 2 104 may be configured to include an encoder circuit, a decoder circuit, and a transceiver (Tx/Rx) similar to the device 1 102 in FIG. 4A. Accordingly, in one embodiment, the device 2 104 may be configured to perform operations similar to those previously discussed with reference to device 1 102 in FIG. 4A. Therefore, the architecture disclosed in FIGS. 4A and 4B enables the device 1 102 and device 2 104 to communicate multiple serial communication signals via an encoded serial communication signal over the communication medium 110. It should be noted that the device 1 102 (or the device 2 104) may transmit or receive the encoded serial communication signal asynchronously over the communication medium 110.

Figure 5A:
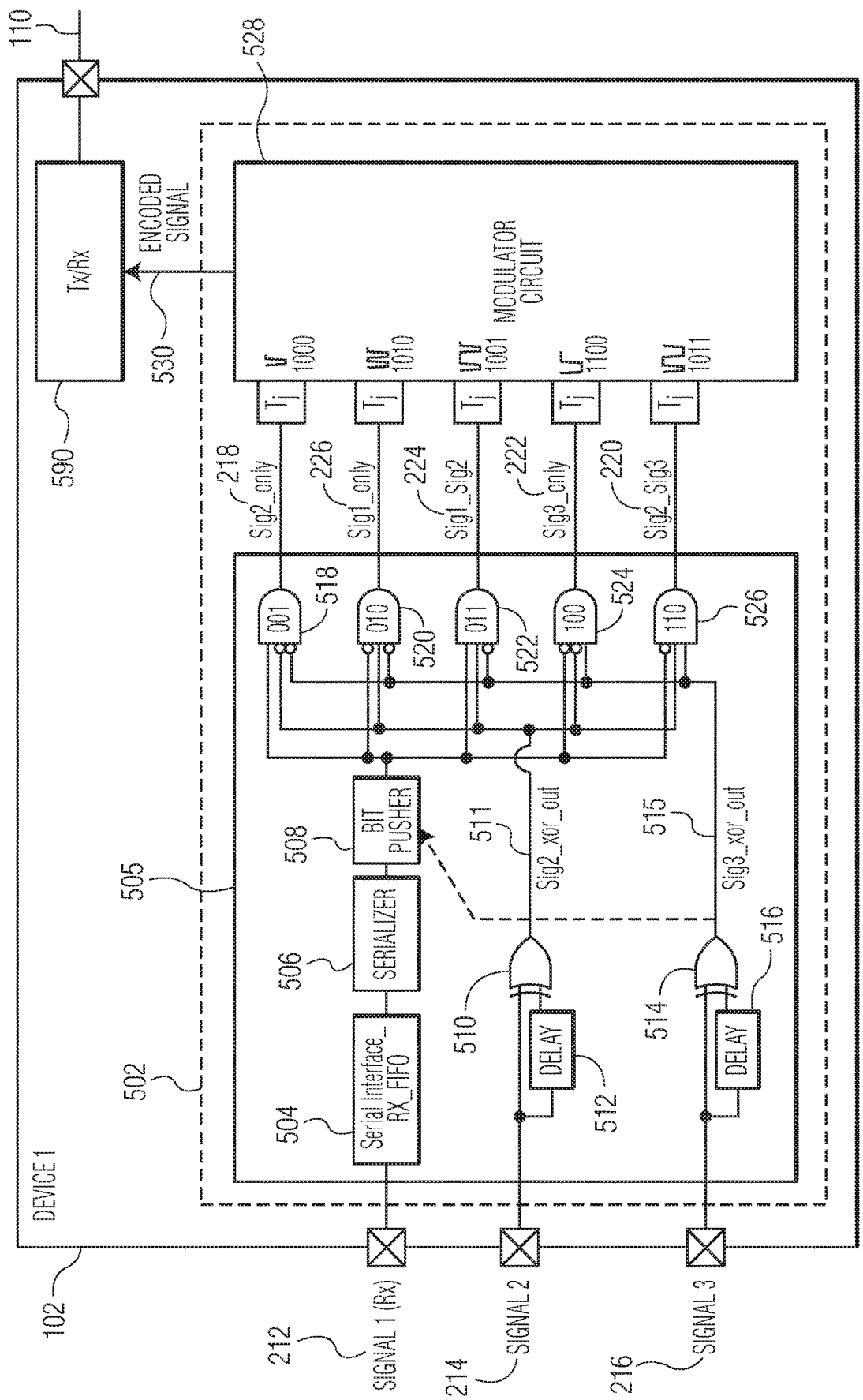
FIG. 5A depicts an exemplary implementation of an encoder circuit in accordance with various embodiments of the disclosure.

FIG. 5A depicts an exemplary implementation of an encoder circuit in accordance with various embodiments of the disclosure. As shown in FIG. 5A, an encoder circuit 502 may receive the signal 1 212, the signal 2 214, and the signal 3 216 and may implement a signal edge detector circuit 505 to detect a set of edges of the signal 1 212, the signal 2 214, and the signal 3 216. For example, the encoder circuit 502 may use the FIFO buffer 504, serializer circuit 506, and the bit pusher 508 to detect a signal edge (e.g., a bit to be transmitted over the communication medium 110) of signal 1 212. That is, the device 1 102 may treat the bits in the FIFO buffer 504 as signal edges of the signal 1 212. In an embodiment, the FIFO buffer 504 may be configured to receive and store bits provided through a serial interface, such as a UART interface.

The encoder circuit 502 may use the exclusive OR (XOR) gate 510 and the signal delay device 512 to detect a signal edge of signal 2 214, and may use the exclusive OR (XOR) gate 514 and the signal delay device 516 to detect a signal edge of signal 3 216. Each of the AND gates 518, 520, 522, 524, and 526 may be configured to detect one of the five possible sets of signal edges that may occur during a time period. For example, the AND gate 518 may output a pulse (e.g., a momentary logic '1' in the edge detection signal Sig2_only 218) when a first set of signal edges including only a signal edge of signal 2 214 is detected. The AND gate 526 may output a pulse (e.g., a momentary logic '1' in the edge detection signal Sig2_Sig3 220) when a second set of signal edges including a signal edge of signal 2 214 and a signal edge of signal 3 216 is detected. The AND gate 524 may output a pulse (e.g., a momentary logic '1' in the edge detection signal Sig3_only 222) when a third set of signal edges including only a signal edge of signal 3 216 is detected. The AND gate 522 may output a pulse (e.g., a momentary logic '1' in the edge detection signal Sig1_Sig2 224) when a fourth set of signal edges including a signal edge of signal 1 212 and a signal edge of signal 2 214 is detected. The AND gate 520 may output a pulse (e.g., a momentary logic '1' in the edge detection signal Sig1_only 226 226) when a fifth set of signal edges including only a signal edge of signal 1 212 is detected. In an embodiment, each of the edge detection signals (e.g., Sig2_only 218, Sig1_only 226, Sig1_Sig2 224, Sig3_only 222, Sig2_Sig3 220) may have a jitter tolerance $T_j$. The jitter tolerance $T_j$ may indicate a maximum allowed jitter. For example, the jitter tolerance $T_j$ may be less than or equal to 3 ns (e.g., $T_j \leq 3$ ns).

The modulator circuit 528 may be configured to obtain a predetermined code corresponding to a detected set of signal edges. For example, the AND gate 526 may output a pulse (e.g., a momentary logic '1' in Sig2_Sig3 220) when the second set of signal edges including a signal edge of signal 2 214 and a signal edge of signal 3 216 is detected. As shown in the example modulation scheme in FIG. 6, the modulator circuit 528 may use the pulse in the edge detection signal Sig2_Sig3 220 to generate a code (e.g., code '1011') that corresponds to the second set of signal edges. The device 1 102 may then transmit the code (e.g., code '1011') in an encoded serial communication signal 530 that includes a series of pulses indicating the bit values of the code to the device 2 104. A series of pulses indicating the bit values of a code are also herein referred to as a symbol. In one embodiment, only one symbol may be transmitted over the communication medium 110 at a time. In an embodiment, the transceiver 590 may be configured to operate in a transmission mode to transmit the encoded serial communication signal 530 over the communication medium 110.

Figure 6:
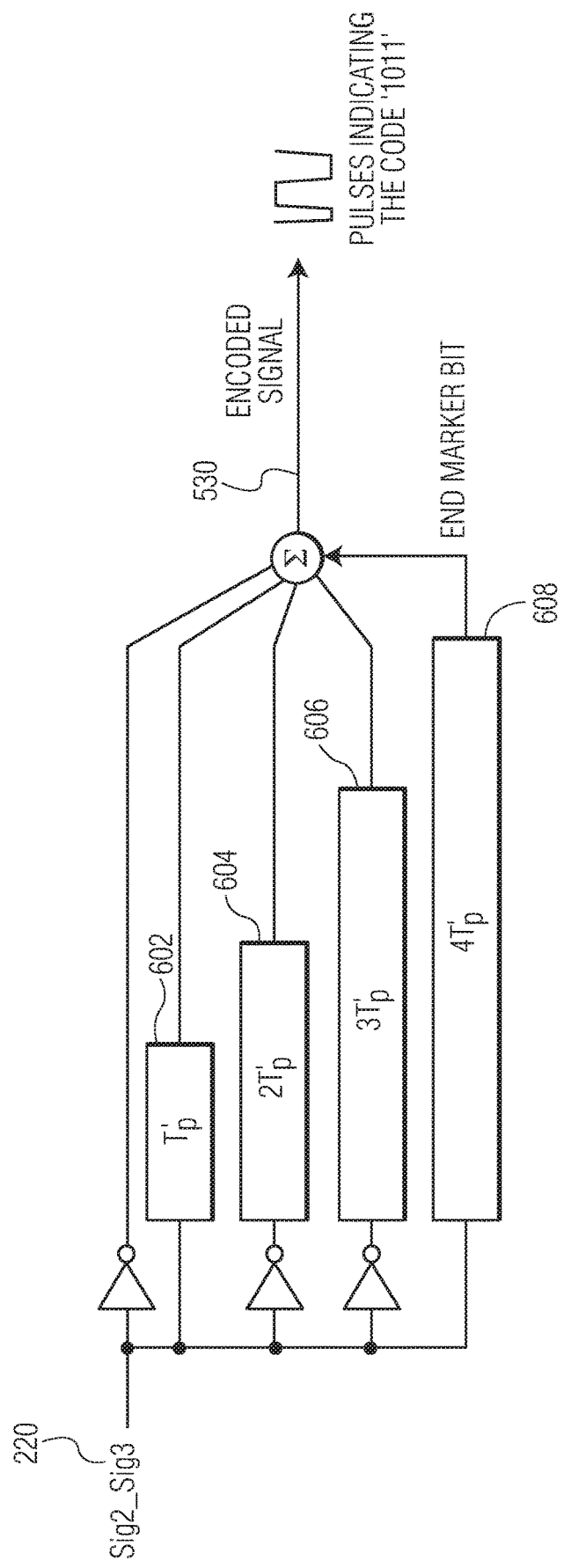
FIG. 6 depicts an example modulation scheme in accordance with various embodiments of the disclosure.

As shown in the example implementation of FIG. 6, one or more of the pulses in the series of pulses indicating the bit values of the code may be generated from a delayed version of the pulse in the edge detection signal Sig2_Sig3 220. In an embodiment, the original pulse in the edge detection signal Sig2_Sig3 220 (e.g., output from the AND gate 110 in FIG. 5A) may be delayed by the signal delay device 602 for a period of approximately $T_p'$, delayed by the signal delay device 604 for a period of approximately $2T_p'$, delayed by the signal delay device 606 for a period of approximately $3T_p'$, and delayed by the signal delay device 608 for a period of approximately $4T_p'$. In one example, $T_p'$ may be less than or equal to 10 ns (e.g., $T_p' \leq 10$ ns). Therefore, in one example implementation, if $T_p'$ is approximately 10 ns, the original pulse in the edge detection signal Sig2_Sig3 220 may be delayed by the signal delay device 602 for a period of approximately 10 ns, delayed by the signal delay device 604 for a period of approximately 20 ns, delayed by the signal delay device 606 for a period of approximately 30 ns, and delayed by the signal delay device 682 for a period of approximately 40 ns.

In an embodiment, device 1 102 may transmit the code (e.g., code '1011') that corresponds to the second set of signal edges along with an end marker bit within a time period of approximately 40 nanoseconds. As shown in FIG. 5A, the modulator circuit 528 may use the pulses in the other edge detection signals (e.g., Sig2_only 218, Sig1_only 226, Sig1_Sig2 224, Sig3_only 222) to generate different codes.

Figure 5B:
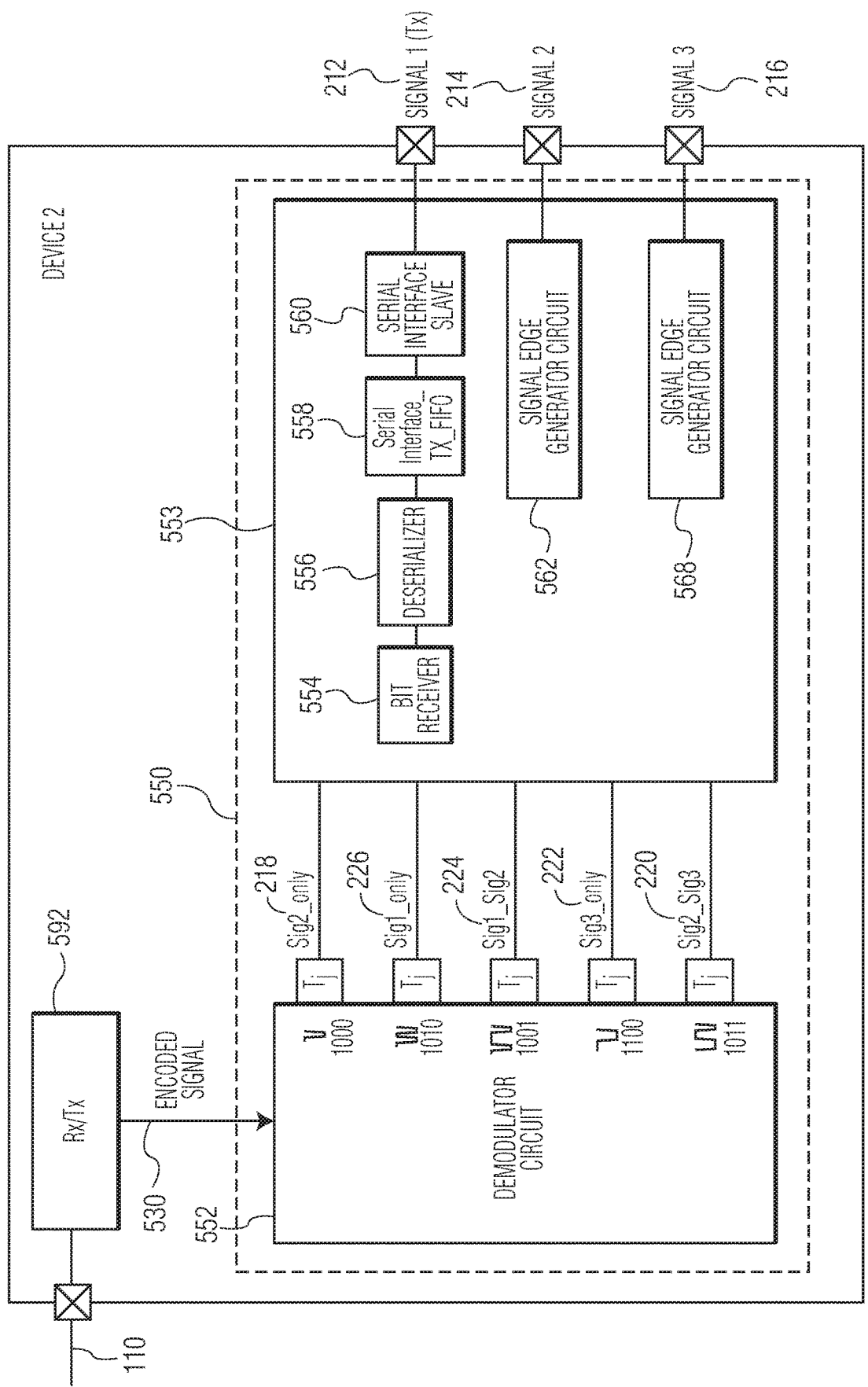
FIG. 5B depicts an exemplary implementation of a decoder circuit in accordance with various embodiments of the disclosure.

FIG. 5B depicts an exemplary implementation of a decoder circuit in accordance with various embodiments of the disclosure. As shown in FIG. 5B, a decoder circuit 550 may receive the encoded serial communication signal 530 through the communication medium 110 and may implement a signal edge generator circuit 553 to reconstruct the signal 1 212, the signal 2 214, and the signal 3 216. In an embodiment, the transceiver 592 may be configured to operate in a reception mode to receive the encoded serial communication signal 530 over the communication medium 110. For example, with reference to the example demodulation scheme in FIG. 7, the demodulator circuit 552 may sequentially delay the encoded serial communication signal 530 to obtain a code (e.g., code '1011') that corresponds to a set of signal edges. In an embodiment, the demodulator circuit 552 may implement one or more signal delay devices (e.g., signal delay devices 706, 708, 710, 712) to delay the encoded serial communication signal 530. In an embodiment, the encoded serial communication signal 530 may be delayed by the signal delay device 706 for a period of approximately $T_p'$, delayed by the signal delay device 708 for a period of approximately $2T_p'$, delayed by the signal delay device 710 for a period of approximately $3T_p'$, and delayed by the signal delay device 712 for a period of approximately $4T_p'$. In one example, $T_p'$ may be less than or equal to 10 ns (e.g., $T_p' \leq 10$ ns).

Figure 7:
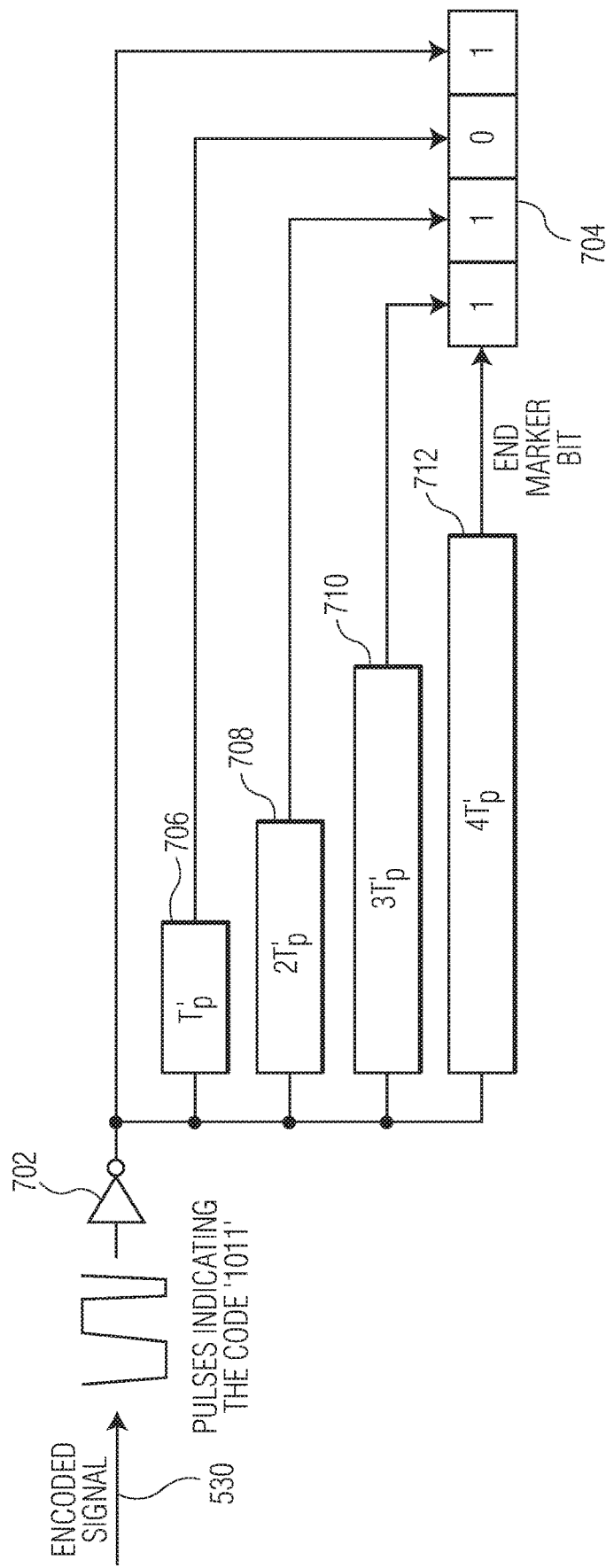
FIG. 7 depicts an example demodulation scheme in accordance with various embodiments of the disclosure.

In the example of FIG. 7, since the encoded serial communication signal 530 may be inverted to facilitate transmission over the communication medium 110, the demodulator circuit 552 may invert the encoded serial communication signal 530 using the inverter 702 and may store each bit recovered from the encoded serial communication signal 530 in the four-bit latch 704. The code (e.g., code '1011') stored in the four-bit latch 704 may be in reverse order due to the order in which the bits recovered from the encoded serial communication signal 530 are stored in the four-bit latch 704.

The demodulator circuit 552 may generate a pulse in the edge detection signal corresponding to the code obtained from the encoded serial communication signal 530. In an embodiment, the demodulator circuit 552 may reference a truth table (e.g., the truth table 300) to obtain the set of signal edges corresponding to the code. For example, when the demodulator circuit 552 obtains the code '1011' from the encoded serial communication signal 530, the demodulator circuit 552 may generate a pulse in the edge detection signal Sig2_Sig3 220. In response to the pulse in the edge detection signal Sig2_Sig3 220, the signal edge generator circuit 562 may reconstruct the signal 2 216 by generating a signal edge in the signal 2 216. The signal edge generator circuit 568 may reconstruct the signal 3 218 by generating a signal edge in the signal 3 216. In other examples, the bit receiver 554, deserializer 556, FIFO buffer 558, and the serial interface slave device 560 may be used to reconstruct the signal 1 212 in response to a pulse in the edge detection signal Sig1_only 218 or the edge detection signal Sig1_Sig2 224. In one example, the serial interface slave device 560 may be a UART slave device.

Figure 8:
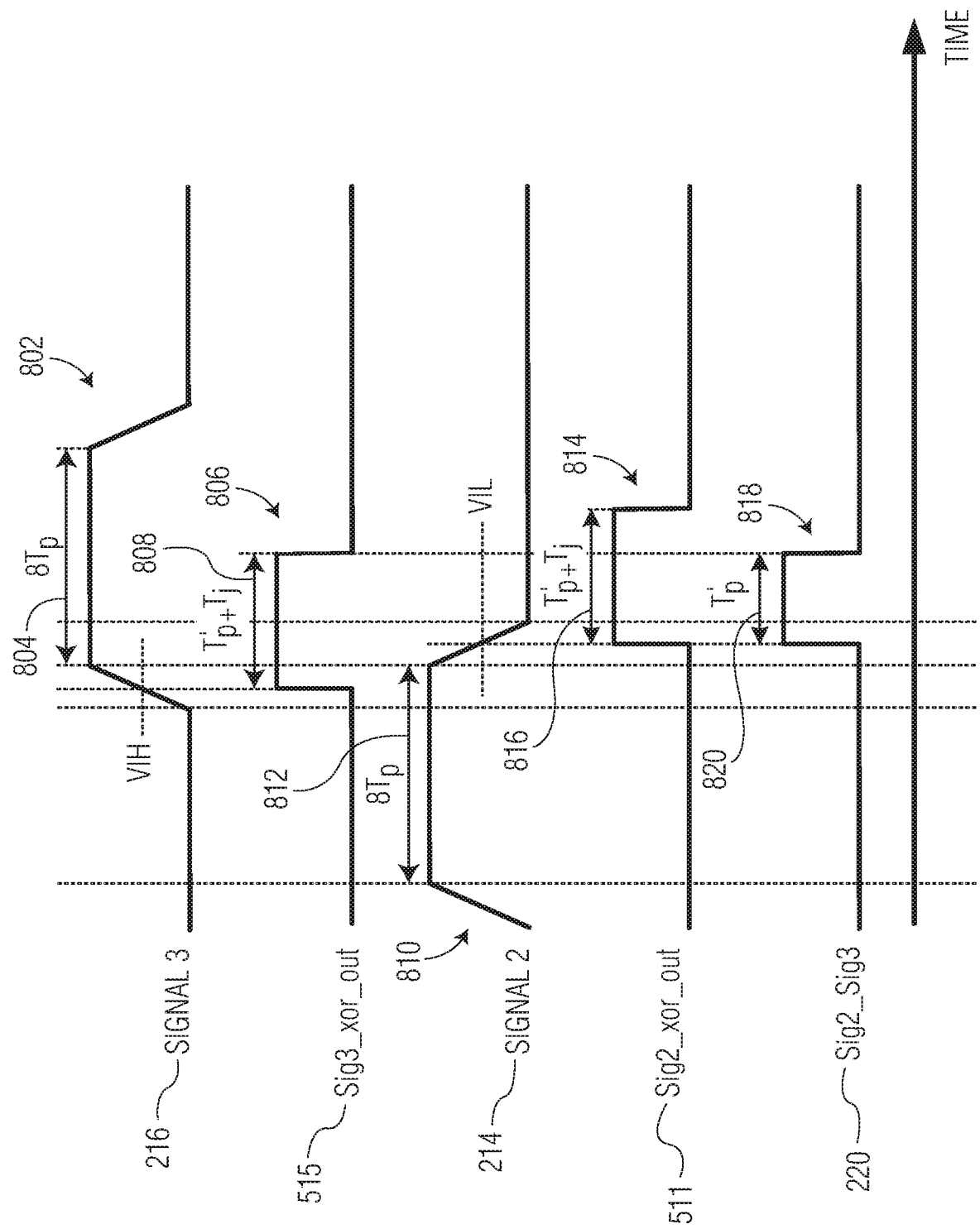
FIG. 8 depicts the skew handling between example signals in accordance with various embodiments of the disclosure.

FIG. 8 depicts the skew handling between signal 3 216 and signal 2 214. In some situations, signal edge detections may be susceptible to jitter caused by the voltage input high (VIH), voltage input low (VIL) thresholds. In an embodiment, the signal delay devices 512, 516 may apply a delay wide enough for the design needs of the modulator circuit 528, as well as for skew compensation. In an embodiment, the signal delay devices 512, 516 may be analog delay devices. In some scenarios, there may be a skew between the XOR outputs Sig3_xor_out 515 and Sig2_xor_out 511. Therefore, the output of the AND gate 526 (e.g., the edge detection signal Sig2_Sig3 220) may capture the overlapping period and may create a pulse for the modulator circuit 528. For example, the disclosed aspects may handle up to 3 ns of skew between the XOR outputs Sig3_xor_out 515 and Sig2_xor_out 511.

In an example scenario, a pulse 802 in the edge detection signal 3 216 may have a pulse duration 804. In this example scenario, the pulse duration 804 may be expressed as $8T_p$ and may define a time window as described herein. For example, if $T_p$ is approximately 10 ns, the time window may be approximately 80 ns. As shown in FIG. 8, a pulse 806 in the signal Sig3_xor_out 515 may have a pulse duration 808. In this example scenario, the pulse duration 808 may be $T_p' + T_j$, where $T_p'$ may be less than or equal to the previously described pulse duration value $T_p$ (e.g., $T_p' \leq 10$ ns), and where $T_j$ is the jitter tolerance. In one example, the jitter tolerance $T_j$ may be less than or equal to 3 ns (e.g., $T_j \leq 3$ ns).

As further shown in FIG. 8, a pulse 810 in the signal 2 214 may have a pulse duration 812. In this example scenario, the pulse duration 812 may be expressed as $8T_p$. A pulse 814 in the signal Sig2_xor_out 511 may have a pulse duration 816. In this example scenario, the pulse duration 816 may be $T_p' + T_j$. Therefore, the result of an AND operation of the signals Sig2_xor_out 511 and Sig3_xor_out 515 may be the edge detection signal Sig2_Sig3 220 including the pulse 818. The pulse duration 820 of the pulse 818 may be $T_p'$ (e.g., $T_p' \leq 10$ ns).

The device 1 102 may detect a set of signal edges of the signal 1 212, signal 2 214, and signal 3 216 during a time period (also herein referred to as a time window). In one embodiment, the time period may be approximately equal to a pulse duration in the signal 1 212, signal 2 214, or signal 3 216. For example, the time period may be approximately equal to the pulse duration 231 of the pulse 229 in signal 2 214.

Figure 9:
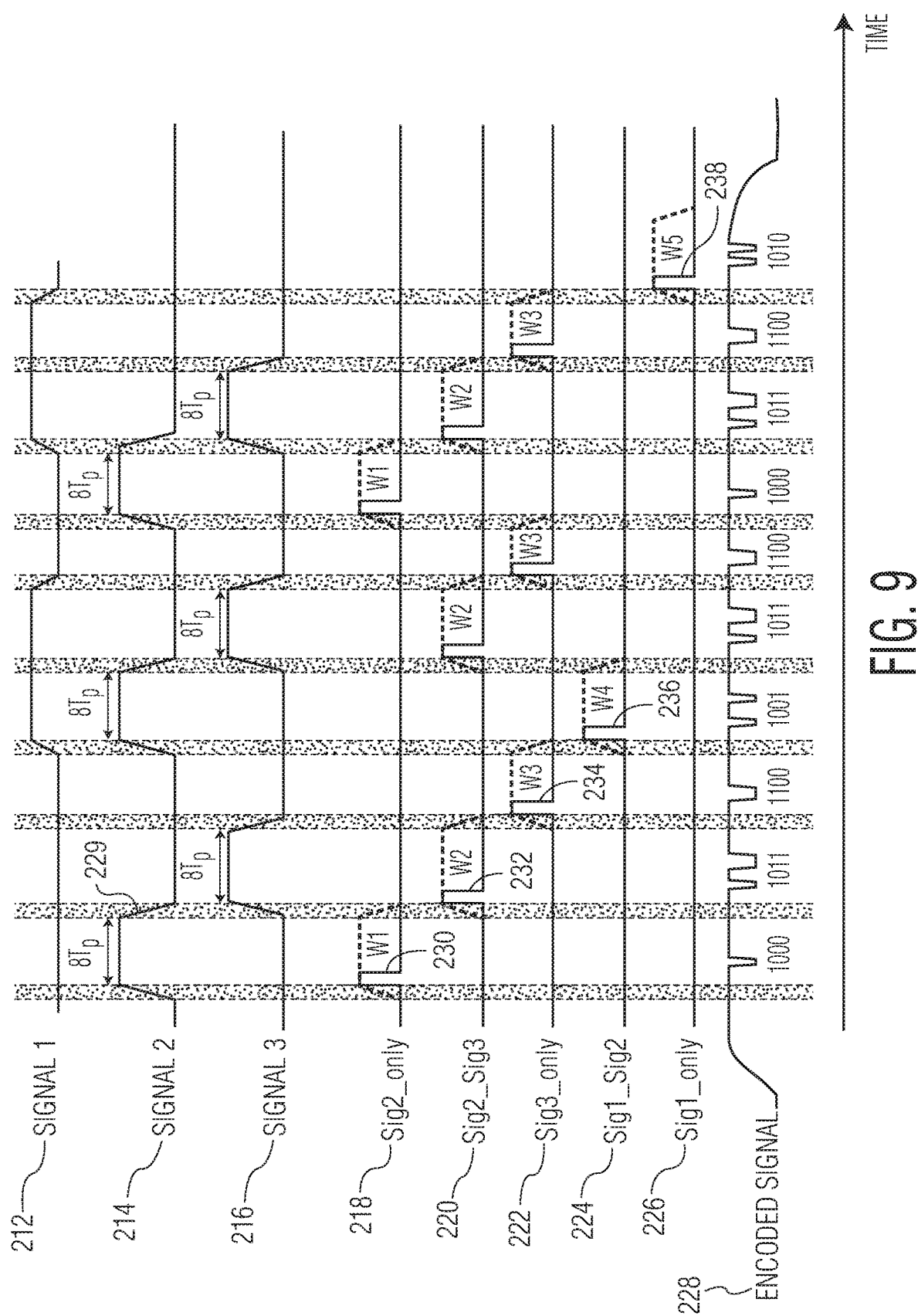
FIG. 9 depicts a signal diagram showing Wi time windows in accordance with various embodiments of the disclosure.

FIG. 9 depicts a signal diagram showing Wi time windows (e.g., where i=1, 2, 3, 4, 5) in accordance with various embodiments of the disclosure. The signal diagram in FIG. 9 includes the same configuration of signals as in the signal diagram of FIG. 2 with the addition of time windows W1, W2, W3, W4 and W5 (also herein referred to as time periods W1, W2, W3, W4 and W5). Each of these time windows may be exclusive with respect to one another and may be implemented based on a signal edge of a signal (e.g., a signal edge of the signal 1 212, signal 2 214, signal 3 216). Since only one set of detected signal edges may be communicated over the communication medium 110 at a time, only one code corresponding to the set of detected edges may be serially transmitted over the communication medium 110 during a given time window. For example, the code '1000' indicating a signal edge of signal 2 may be transmitted only during time window W1, the code '1011' indicating a signal edge of signal 2 and a signal edge of signal 3 may be transmitted only during time window W2, the code '1100' indicating a signal edge of signal 3 may be transmitted only during time window W3, and so on.

Figure 10:
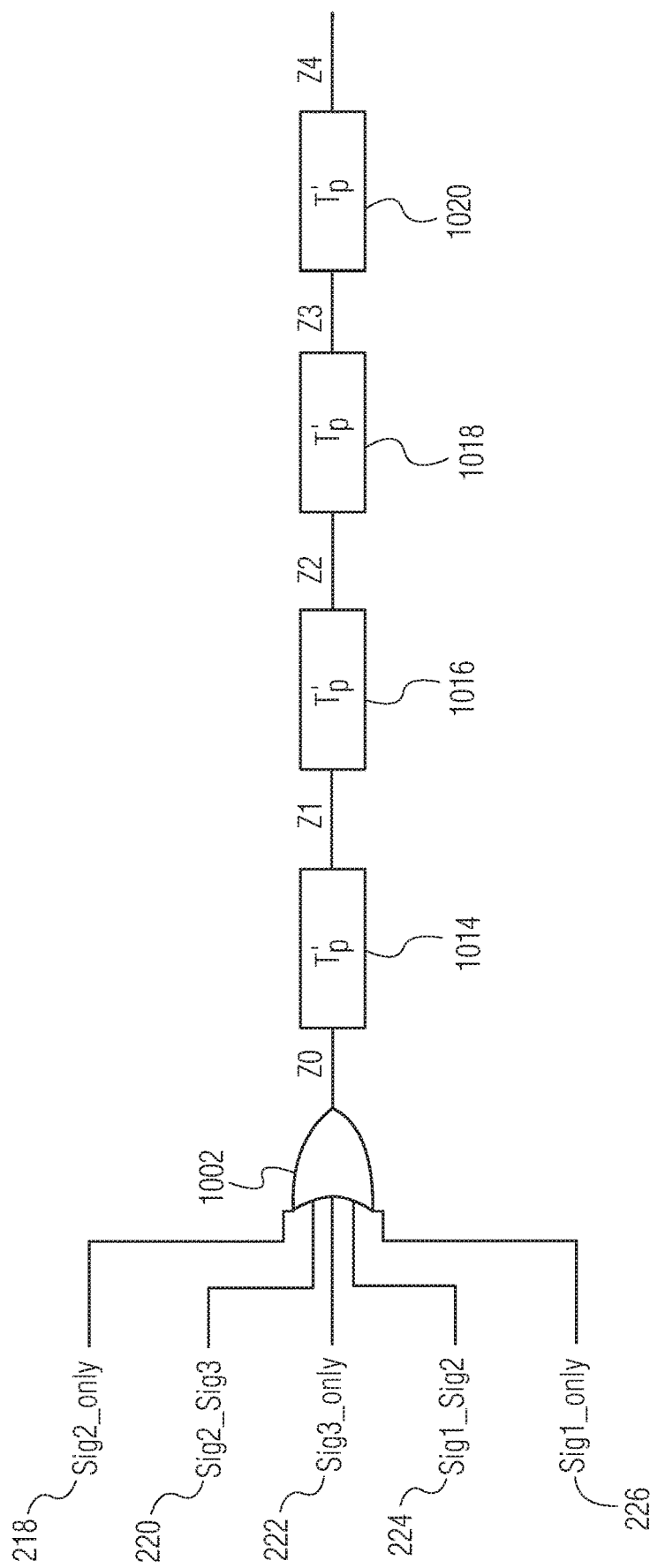
FIG. 10 depicts a circuit for generating a sequence of delayed pulses that may be used to obtain a code corresponding to a set of detected signal edges in accordance with various embodiments of the disclosure.

FIG. 10 shows a circuit for generating a sequence of delayed pulses that may be used to obtain a code corresponding to a set of detected signal edges. As shown in FIG. 10, the inputs of an OR gate 1002 may be configured to receive the edge detection signals Sig2_only 218, Sig2_Sig3 220, Sig3_only 222, Sig1_Sig2 224, and Sig1_only 226. When a pulse occurs in the edge detection signal Sig2_only 218, Sig2_Sig3 220, Sig3_only 222, Sig1_Sig2 224, or Sig1_only 226, the device 1 102 (or the device 2 104) may delay the pulse a number of times to obtain delayed versions of the pulse. In an embodiment, and as shown in FIG. 10, Z0 may represent the original pulse with no delay, and Z1, Z2, Z3, and Z4 may represent successively delayed versions of the original pulse. In an embodiment, and as explained in detail with reference to FIG. 11, each of the signal delay devices 1014, 1016, 1018, and 1020 may be configured to delay a pulse for a period of approximately $T_p'$. In one example, $T_p'$ may be less than or equal to 10 ns (e.g., $T_p' \leq 10$ ns). In an example scenario, if $T_p'$ is approximately 10 ns, the delayed pulse Z4 may be delayed by 40 ns relative to the original pulse Z0. In an embodiment, the signal delay devices 1014, 1016, 1018, and 1020 may be analog delay devices that can accurately apply a delay of $T_p'$.

Figure 11:
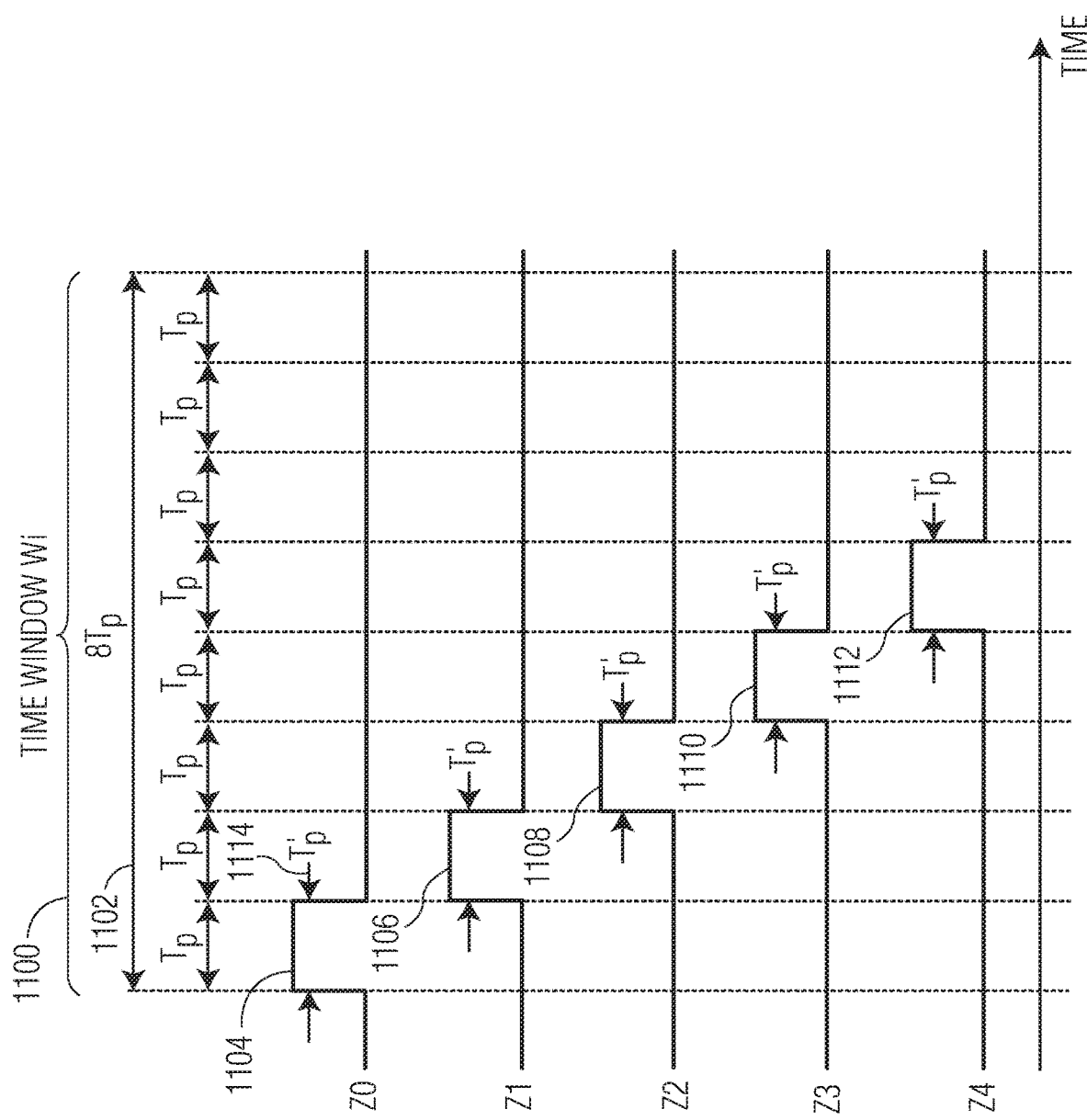
FIG. 11 depicts a signal diagram showing an edge detection signal and delayed versions of the edge detection signal.

FIG. 11 depicts a signal diagram showing an edge detection signal and delayed versions of the edge detection signal. FIG. 11 includes a time window Wi 1100 having a duration 1102. In this example scenario, the duration 1102 may be expressed as $8T_p$. For example, if the pulse duration value $T_p$ is approximately 10 ns, the duration 1102 of the time window Wi 1100 may be approximately 80 ns. As shown in FIG. 11, a pulse 1104 in an edge detection signal may have a pulse duration 1114. In one embodiment, the pulse duration 1114 may be $T_p'$, where $T_p'$ may be less than or equal to the pulse duration value $T_p$ (e.g., $T_p' \le T_p$). It should be noted that in the example implementation of FIG. 11, $T_p'$ is approximately equal to the pulse duration value $T_p$.

In FIG. 11, Z0 may represent an original edge detection signal with no delay, and Z1, Z2, Z3, and Z4 may represent successively delayed versions of the original edge detection signal. In an embodiment, Z0 may represent any one of the original edge detection signals Sig2_only 218, Sig2_Sig3 220, Sig3_only 222, Sig1_Sig2 224, Sig1_only 226. For example, Z1 may represent a version of the original edge detection signal that has been delayed by a period of approximately $T_p'$, Z2 may represent a version of the original edge detection signal that has been delayed by a period of approximately $2T_p'$, Z3 may represent a version of the original edge detection signal that has been delayed by a period of approximately $3T_p'$, and Z4 may represent a version of the original edge detection signal that has been delayed by a period of approximately $4T_p'$. In one example, $T_p'$ may be less than or equal to 10 ns (e.g., $T_p' \le 10$ ns). In one example implementation, the delayed pulses 1106, 1108, 1110, 1112 may serve as the previously described sequence of delayed pulses that may be used to obtain a code corresponding to a set of detected signal edges.

Figure 12:
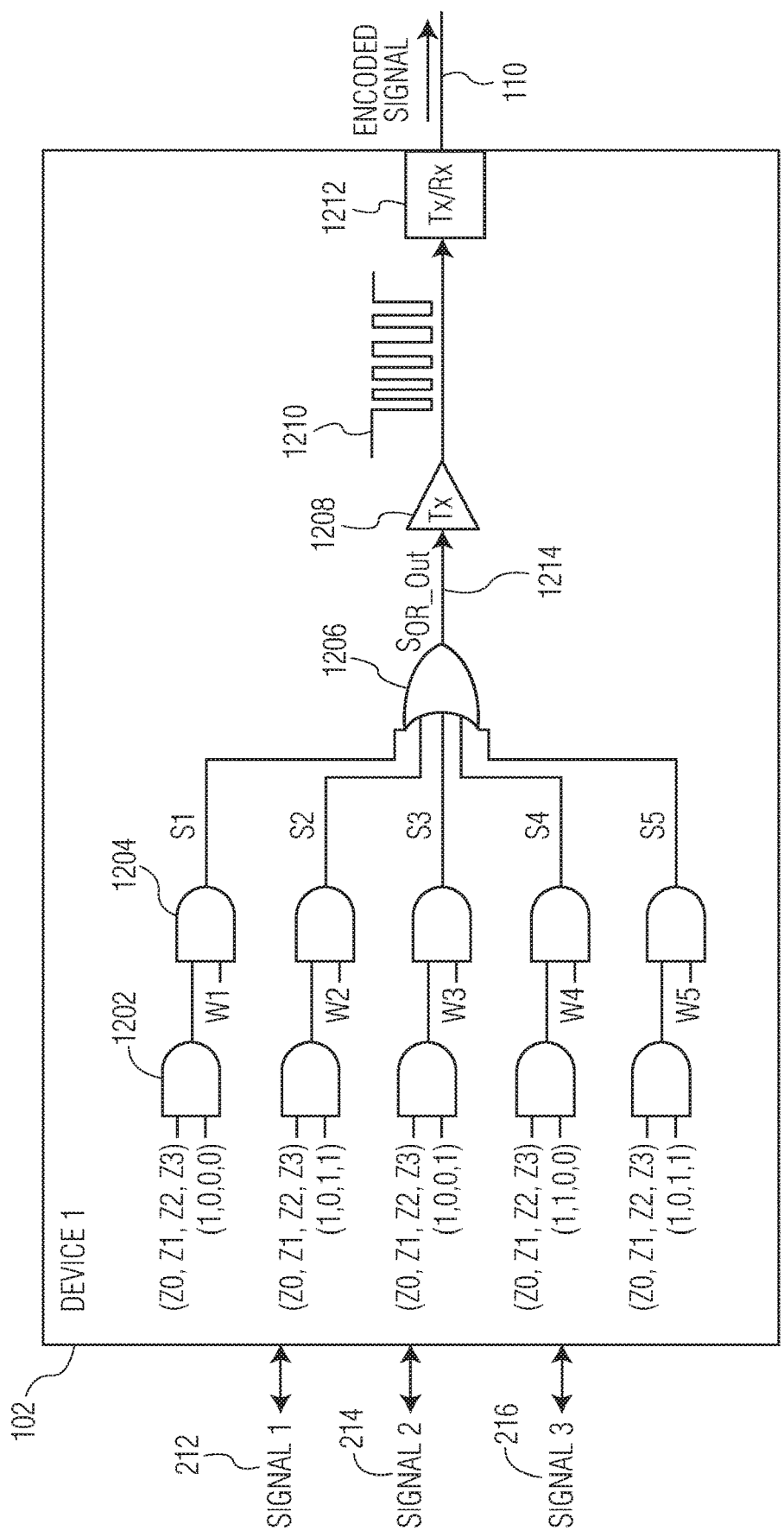
FIG. 12 depicts an architecture for obtaining a code corresponding to a detected set of signal edges in accordance with various embodiments of the disclosure.

FIG. 12 shows an architecture for obtaining a code corresponding to a detected set of signal edges. In an embodiment, the architecture shown in FIG. 12 may be implemented at the modulator circuit 462 in FIG. 4A. As shown in FIG. 12, a number of AND gates (e.g., AND gates 1202, 1204) may be configured to generate the signals S1, S2, S3, S4, and S5 based on the following equations:

$S1 = "(Z0,Z1,Z2,Z3)"$ AND $"(1,0,0,0)"$ AND $"W1"$ $S2 = "(Z0,Z1,Z2,Z3)"$ AND $"(1,0,1,1)"$ AND $"W2"$ $S3 = "(Z0,Z1,Z2,Z3)"$ AND $"(1,0,0,1)"$ AND $"W3"$ $S4 = "(Z0,Z1,Z2,Z3)"$ AND $"(1,1,0,0)"$ AND $"W4"$ $S5 = "(Z0,Z1,Z2,Z3)"$ AND $"(1,0,1,1)"$ AND $"W5"$.

The terms W1, W2, W3, W4, and W5 in the equations for generating the signals S1, S2, S3, S4, and S5 may represent a time window having a duration $8T_p$ and may ensure that only one code (e.g., code '1000', '1011', '1100', 1001, or '1010') is communicated during a time window. The OR gate 1206 may be configured to receive the signals S1, S2, S3, S4, and S5 and to output the signal $S_{OR\_out}$ 1214 (e.g., $S_{OR\_out} = $ "S1" OR "S2" OR "S3" OR "S4" OR "S5"). The signal $S_{OR\_out}$ 1214 may be an example implementation of the encoded serial communication signal (e.g., the encoded serial communication signal 228) described herein.

For example, if a signal edge is detected only in signal 2 214, the edge detection signal Sig2_only 218 may include a pulse (e.g., a momentary logic '1' in the edge detection signal Sig2_only). The original pulse (e.g., represented as the term Z0) may be delayed to obtain a number of delayed versions of the pulse (e.g., represented as the terms Z1, Z2, and Z3) as previously described with reference to FIGS. 10 and 11. When a signal edge is detected only in signal 2 214, the term W1 may be set to logic '1' to indicate that the time window W1 is selected, while the terms W2, W3, W4, and W5 may be set to logic '0'. Accordingly, in this example, the code '1000' may be output by the OR gate 1206 and transferred through the buffer 1108 as a series of pulses 1210 that indicate the logic value '1000'. The transceiver 1212 may be configured to operate in a transmission mode and may transmit the series of pulses 1110 over the communication medium 110. In an embodiment, the series of pulses 1210 may be the encoded serial communication signal. In an embodiment, the encoded serial communication signal (e.g., the series of pulses 1210) representing the code '1000' may be transmitted directly over the communication medium 110 or transmitted using a different modulation scheme.

Figure 13:
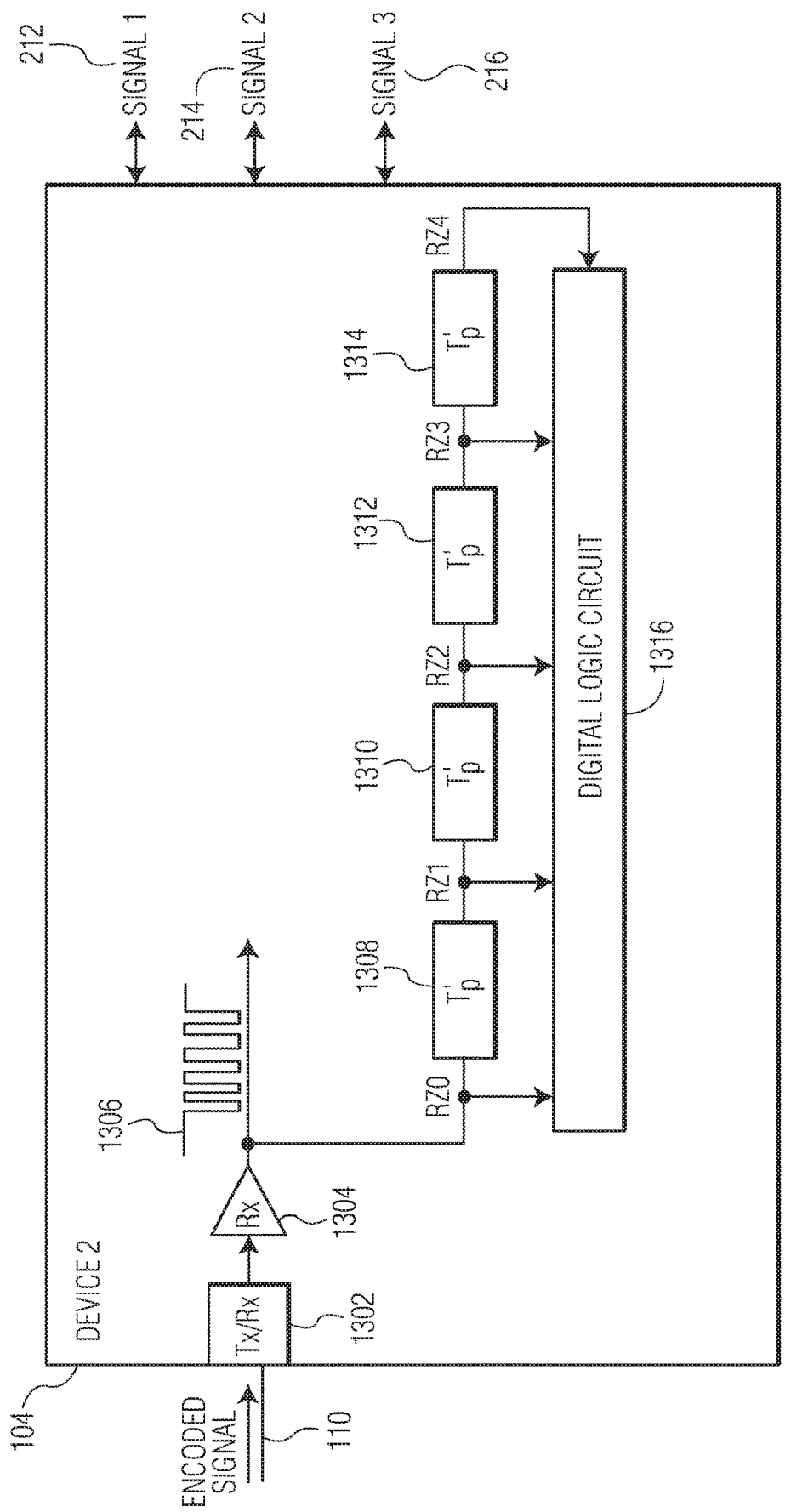
FIG. 13 depicts an example architecture for obtaining a code that indicates a detected set of signal edges from an encoded serial communication signal in accordance with various embodiments of the disclosure.

FIG. 13 shows an example architecture for obtaining a code that indicates a detected set of signal edges from an encoded serial communication signal in accordance with various embodiments of the disclosure. In an embodiment, the architecture shown in FIG. 13 may be implemented at the demodulator circuit 472 in FIG. 4A. As shown in FIG. 13, the transceiver 1302 of device 2 104 may be configured to operate in a reception mode to receive the encoded serial communication signal over the communication medium 110. A buffer 1304 may provide the encoded serial communication signal (shown as the series of pulses 1306 in FIG. 13) to a series of signal delay devices 1308, 1310, 1312, 1314. In an embodiment, and as shown in FIG. 13, RZ0 may represent the original encoded serial communication signal with no delay, and the terms RZ1, RZ2, RZ3, and RZ4 may represent successively delayed versions of the original encoded serial communication signal (e.g., the series of pulses 1306).

In an embodiment, each of the signal delay devices 1308, 1310, 1312, and 1314 may be configured to delay the encoded serial communication signal for a period of approximately $T_p'$. In one example, $T_p'$ may be less than or equal to 10 ns (e.g., $T_p' \le 10$ ns). Therefore, in one example implementation, if $T_p'$ is approximately 10 ns, the device 2 104 may obtain each bit of the code (e.g., code '1000') from the encoded serial communication signal during each 10 ns delay period. In this example, the device 2 104 may obtain a first bit of the code from the original encoded serial communication signal (e.g., RZ0) and may obtain the fourth bit of the code from the delayed encoded serial communication signal (e.g., RZ3). The device 2 104 may obtain a fifth bit that serves as an end marker bit for the code from the last delayed version of the encoded serial communication signal (e.g., RZ4). Therefore, in this example implementation, all four bits of the code (e.g., code '1000') in the encoded serial communication signal and the end marker bit may be obtained over a time period of approximately 40 ns.

The four bits of the code may be stored in a four-bit latch in the digital logic circuit 1216. It should be noted that the code stored in the four-bit latch may be in reverse order due to the order in which the bits of the code are obtained from the encoded serial communication signal. The digital logic circuit 1216 may obtain the set of signal edges of the signal 1 212, signal 2 214, signal 3 216 corresponding to the code and may reconstruct the signal edges of the signal 1 212, signal 2 214, and/or signal 3 216 accordingly.

In one example scenario, signal 1 212 may be a single-ended signal for serial data communication, such as a UART signal, an $I^2C$ signal, a JTAG signal, or other suitable type of single-ended signal, signal 2 214 may be a first signal of a differential signaling pair (e.g., the eDN signal of an embedded USB (eUSB) data signal), and signal 3 216 may be a second signal of the differential signaling pair (e.g., the eDP signal of the eUSB data signal). In this scenario, the serialization techniques disclosed herein may enable UART communications concurrently with eUSB communications over a communication medium (e.g., the communication medium 110). If full speed eUSB is implemented, signal 2 214 may be toggling (e.g., may include a signal edge) at most times. Both signal 2 214 and signal 3 216 may have a signal edge when transitioning from the K state to the SE0 state, and from the SE0 state to the K state. In an embodiment, bits carried in signal 1 212 (e.g., UART bits) may be pushed on the communication medium 110 with or without a signal edge in signal 2 214, but may not be pushed on the communication medium 110 with a signal edge in signal 3 216. In an embodiment, if UART communications and eUSB communications are to be encoded and transmitted over a communication medium (e.g., the communication medium 110), the eUSB communications may need to maintain a data rate of approximately 12 Mbaud (e.g., a bit period of approximately 83.33 ns). In this embodiment, unused symbols may also need to be implemented for a handshake procedure between a host device and a client device.

The embodiments disclosed herein enable asynchronous serialization and/or deserialization of an N number (e.g., N≥2) of signals independent of a clock signal. Therefore, the embodiments disclosed herein may provide a cost-effective solution for serializing/deserializing signals by avoiding the need for costly high-accuracy clock signal generating circuits. Moreover, the N number of signals may be reconstructed without the need for clock data recovery (CDR) operations. The serializing techniques disclosed herein may introduce an insignificant amount of jitter (e.g., less than 3 ns) to each of the N number of signals and may be implemented independent of the frequencies of the N number of signals.

Figure 14:
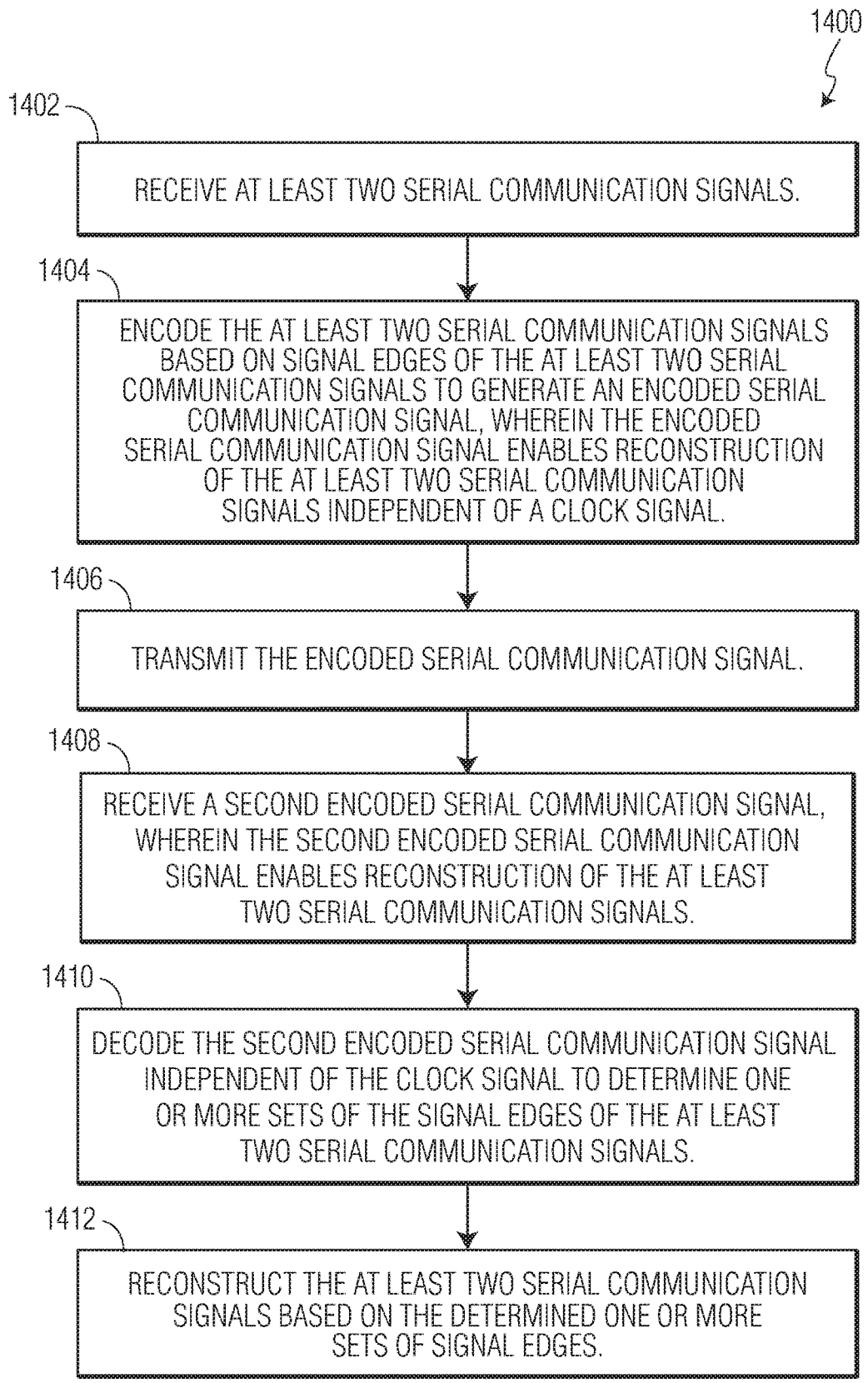
FIG. 14 is a process flow diagram of an example method for asynchronous serialization of at least two serial communication signals in an electronic device.

FIG. 14 is a process flow diagram 1400 of an example method for asynchronous serialization of at least two serial communication signals in an electronic device. In an embodiment, at block 1402, the method receives at least two serial communication signals (e.g., signal 1 212, signal 2 214, and signal 3 216). In an embodiment, the at least two serial communication signals may be associated with two or more different serial communication protocols (e.g., USB, eUSB, UART, I²C, JTAG).

At block 1404, the method encodes the at least two serial communication signals based on signal edges of the at least two serial communication signals to generate an encoded serial communication signal (e.g., encoded serial communication signal 228, 530). The encoded serial communication signal may enable reconstruction of the at least two serial communication signals independent of a clock signal. In an embodiment, the method encodes the at least two serial communication signals by detecting a set of the signal edges of the at least two serial communication signals for a time period, and obtains a predetermined code that corresponds to the detected set of signal edges. For example, there may be five possible sets of signal edges that can be detected during a time period, such as a first set that includes only a signal edge of signal 2 214, a second set that includes a signal edge of signal 2 214 and a signal edge of signal 3 216, a third set that includes only a signal edge of signal 3 216, a fourth set that includes only a signal edge of signal 1 212 and a signal edge of signal 2 214, and a fifth set that includes only a signal edge of signal 1 212. For example, the predetermined code (e.g., code '1000', '1011', '1100', 1001, or '1010') that corresponds to the detected set of signal edges may be obtained from a truth table (e.g., truth table 300). The encoded serial communication signal may include the predetermined code. The predetermined code may enable the reconstruction of the at least two serial communication signals for the time period.

In an embodiment, the method encodes the at least two serial communication signals by detecting a set of the signal edges of the at least two serial communication signals for each of a plurality of time periods (e.g., time windows W1, W2, W3, W4, W5 in FIG. 9) and by obtaining predetermined codes (e.g., code '1000', '1011', '1100', 1001, or '1010') that correspond to the detected set of signal edges in each of the plurality of time periods. In this embodiment, the encoded serial communication signal includes the predetermined codes. The predetermined codes may enable the reconstruction of the at least two serial communication signals for the plurality of time periods.

At block 1406, the method transmits the encoded serial communication signal. In an embodiment, each of the predetermined codes (e.g., code '1000', '1011', '1100', 1001, or '1010') is implemented as a combination of bit values. In this embodiment, the encoded serial communication signal is transmitted via a single wire (e.g., communication medium 110) as a plurality of pulses (e.g., the series of pulses 1210, 1306) that indicate the combination of bit values.

At block 1408, the method receives a second encoded serial communication signal (e.g., encoded serial communication signal 530). The second encoded serial communication signal enables reconstruction of the at least two serial communication signals. For example, the second encoded serial communication signal may be received over the communication medium 110.

At block 1410, the method decodes the second encoded serial communication signal independent of the clock signal to determine one or more sets of the signal edges of the at least two serial communication signals. In an embodiment, the method performs the decoding by obtaining a plurality of codes from the encoded serial communication signal (e.g., by obtaining the code '1000' from the series of pulses 1306). The plurality of codes may enable the reconstruction of the at least two serial communication signals for a plurality of time periods (e.g., time windows W1, W2, W3, W4, W5 in FIG. 9). The method further performs the decoding by matching each of the plurality of codes to a corresponding set of signal edges of the at least two serial communication signals. For example, the matching may be performed by implementing a truth table (e.g., truth table 300) and obtaining a detected set of signal edges that corresponds to an obtained code (e.g., code '1000', '1011', '1100', 1001, or '1010').

At block 1412, the method reconstructs the at least two serial communication signals based on the determined one or more sets of signal edges.

The above-described operations for asynchronous serialization of at least two serial communication signals in an electronic device can be implemented in hardware, firmware, or a combination thereof, or implemented in a combination of hardware and software, or implemented in a combination of firmware and software, or implemented in a combination of hardware, firmware, and software.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An electronic device comprising:
    a plurality of input ports configured to receive at least two serial communication signals;
    an encoder circuit configured to encode the at least two serial communication signals based on signal edges of the at least two serial communication signals to generate an encoded serial communication signal, wherein the encoded serial communication signal enables reconstruction of the at least two serial communication signals independent of a clock signal; and
    a transmitter configured to transmit the encoded serial communication signal.

2. The electronic device of claim 1, wherein the encoder circuit comprises:
    a signal edge detector circuit configured to detect a set of the signal edges of the at least two serial communication signals for a time period; and
    a modulator circuit configured to obtain a predetermined code that corresponds to the detected set of signal edges,
    wherein the encoded serial communication signal comprises the predetermined code, and wherein the predetermined code enables the reconstruction of the at least two serial communication signals for the time period.

3. The electronic device of claim 1, wherein the encoder circuit comprises:
    a signal edge detector circuit configured to detect a set of the signal edges of the at least two serial communication signals for each of a plurality of time periods; and
    a modulator circuit configured to obtain predetermined codes that correspond to the detected set of signal edges in each of the plurality of time periods,
    wherein the encoded serial communication signal comprises the predetermined codes, and wherein the predetermined codes enable the reconstruction of the at least two serial communication signals for the plurality of time periods.

4. The electronic device of claim 3, wherein each of the predetermined codes comprises a combination of bit values, and wherein the encoded serial communication signal is transmitted via a single wire as a plurality of pulses that indicate the combination of bit values.

5. The electronic device of claim 1, wherein the at least two serial communication signals are associated with two or more different serial communication protocols.

6. The electronic device of claim 1, further comprising:
    a receiver configured to receive a second encoded serial communication signal, wherein the second encoded serial communication signal enables reconstruction of the at least two serial communication signals;
    a decoder circuit configured to decode the second encoded serial communication signal independent of the clock signal to obtain one or more sets of the signal edges of the at least two serial communication signals; and
    a signal edge generator circuit configured to reconstruct the at least two serial communication signals based on the obtained one or more sets of signal edges.

7. The electronic device of claim 6, wherein the decoder circuit comprises:
    a demodulator circuit configured to obtain a code from the second encoded serial communication signal; and
    a comparing circuit configured to match the code to a corresponding set of signal edges of the at least two serial communication signals.

8. An electronic device comprising:
    a receiver configured to receive an encoded serial communication signal, wherein the encoded serial communication signal enables reconstruction of at least two serial communication signals;
    a decoder circuit configured to decode the encoded serial communication signal independent of a clock signal to obtain one or more sets of signal edges of the at least two serial communication signals; and
    a signal edge generator circuit configured to reconstruct the at least two serial communication signals based on the obtained one or more sets of signal edges.

9. The electronic device of claim 8, wherein the decoder circuit comprises:
    a demodulator circuit configured to obtain a code from the encoded serial communication signal; and
    a comparing circuit configured to match the code to a corresponding set of signal edges of the at least two serial communication signals.

10. The electronic device of claim 8, wherein the decoder circuit comprises:
    a demodulator circuit configured to obtain a plurality of codes from the encoded serial communication signal, wherein the plurality of codes enable the reconstruction of the at least two serial communication signals for a plurality of time periods; and
    a comparing circuit configured to match each of the plurality of codes to a corresponding set of signal edges of the at least two serial communication signals,
    wherein the signal edge generator circuit is further configured to reconstruct the at least two serial communication signals for each of the plurality of time periods.

11. The electronic device of claim 10, wherein each of the plurality of codes comprises a combination of bit values, and wherein the encoded serial communication signal is received via a single wire as a plurality of pulses that indicate the combination of bit values.

12. The electronic device of claim 8, wherein the at least two serial communication signals are associated with two or more different serial communication protocols.

13. The electronic device of claim 8, further comprising
    a plurality of input ports configured to receive the at least two serial communication signals;
    an encoder circuit configured to encode the at least two serial communication signals based on signal edges of the at least two serial communication signals to generate a second encoded serial communication signal, wherein the second encoded serial communication signal enables reconstruction of the at least two serial communication signals independent of a clock signal; and a transmitter configured to transmit the second encoded serial communication signal.

14. The electronic device of claim 13, wherein the encoder circuit comprises:

a signal edge detector circuit configured to detect a set of the signal edges of the at least two serial communication signals for a time period; and a modulator circuit configured to obtain a predetermined code that corresponds to the detected set of signal edges, wherein the second encoded serial communication signal comprises the predetermined code, and wherein the predetermined code enables the reconstruction of the at least two serial communication signals for the time period.

15. A method for an electronic device comprising:

receiving at least two serial communication signals;

encoding the at least two serial communication signals based on signal edges of the at least two serial communication signals to generate an encoded serial communication signal, wherein the encoded serial communication signal enables reconstruction of the at least two serial communication signals independent of a clock signal; and transmitting the encoded serial communication signal.

16. The method of claim 15, wherein the encoding comprises:

detecting a set of the signal edges of the at least two serial communication signals for a time period; and obtaining a predetermined code that corresponds to the detected set of signal edges, wherein the encoded serial communication signal comprises the predetermined code, and wherein the predetermined code enables the reconstruction of the at least two serial communication signals for the time period.

17. The method of claim 15, wherein the encoding comprises:

detecting a set of the signal edges of the at least two serial communication signals for each of a plurality of time periods; and obtaining predetermined codes that correspond to the detected set of signal edges in each of the plurality of time periods, wherein the encoded serial communication signal comprises the predetermined codes, and wherein the predetermined codes enable the reconstruction of the at least two serial communication signals for the plurality of time periods.

18. The method of claim 17, wherein each of the predetermined codes comprises a combination of bit values, and wherein the encoded serial communication signal is transmitted via a single wire as a plurality of pulses that indicate the combination of bit values.

19. The method of claim 15, wherein the at least two serial communication signals are associated with two or more different serial communication protocols.

20. The method of claim 15, further comprising:

receiving a second encoded serial communication signal, wherein the second encoded serial communication signal enables reconstruction of the at least two serial communication signals;

decoding the second encoded serial communication signal independent of the clock signal to determine one or more sets of the signal edges of the at least two serial communication signals; and reconstructing the at least two serial communication signals based on the determined one or more sets of signal edges.

* * * * *